(12) United States Patent
Adamec et al.

(10) Patent No.: US 7,075,075 B2
(45) Date of Patent: Jul. 11, 2006

(54) CHARGED PARTICLE DEFLECTING SYSTEM

(75) Inventors: Pavel Adamec, Haar (DE); Harry Munack, Heimstetten (DE)

(73) Assignee: ICT, Integrated Circuit Testing Gesellschaft fur Halbleiterpruftechnik mbH, Heimstetten (DE)

( * ) Notice: Subject to any disclaimer, the term of this patent is extended or adjusted under 35 U.S.C. 154(b) by 0 days.

(21) Appl. No.: 10/871,879

(22) Filed: Jun. 18, 2004

(65) Prior Publication Data

US 2005/0035292 A1 Feb. 17, 2005

(30) Foreign Application Priority Data

Jun. 18, 2003 (EP) .................................. 03013848

(51) Int. Cl.
*H01J 37/147* (2006.01)
*H01J 37/256* (2006.01)
*H01J 37/28* (2006.01)

(52) U.S. Cl. ................. 250/310; 250/311; 250/396 ML
(58) Field of Classification Search ..................... None
See application file for complete search history.

(56) References Cited

U.S. PATENT DOCUMENTS

| | | | |
|---|---|---|---|
| 3,753,034 A * | 8/1973 | Spicer | 315/382 |
| 3,911,321 A | 10/1975 | Wardly | |
| 4,039,989 A | 8/1977 | Staal et al. | |
| 4,209,698 A | 6/1980 | Hoppe | |
| 4,220,897 A * | 9/1980 | Barten et al. | 315/368.27 |
| 4,242,612 A | 12/1980 | Heijnemans et al. | |
| 4,431,915 A | 2/1984 | Nakagawa et al. | |
| 4,451,737 A * | 5/1984 | Isakozawa | 250/311 |
| 4,608,491 A | 8/1986 | Kokubo | |
| 4,625,145 A * | 11/1986 | Gerritsen et al. | 313/413 |
| 5,136,167 A * | 8/1992 | Langner et al. | 250/396 R |
| 5,276,331 A | 1/1994 | Oae et al. | |
| 5,414,360 A | 5/1995 | Westphal et al. | |
| 5,689,117 A | 11/1997 | Nakasuji | |
| 5,952,667 A | 9/1999 | Shimizu | |
| 5,973,333 A * | 10/1999 | Nakasuji et al. | 250/492.23 |
| 6,064,071 A | 5/2000 | Nakasuji | |
| 6,069,438 A | 5/2000 | Okamoto | |
| 6,104,035 A * | 8/2000 | Muraki | 250/492.22 |
| 6,107,636 A * | 8/2000 | Muraki | 250/492.2 |

(Continued)

FOREIGN PATENT DOCUMENTS

WO WO 99/26272 5/1999

OTHER PUBLICATIONS

International Search Report for Application No. EP 03013848.1, dated Apr. 28, 2004.
P.W. Hawkes et al., "Deflection Systems," *Principles of Electron Optics*, Academic Press 1989 vol. 2, Chapter 40: pp. 822-854.

(Continued)

*Primary Examiner*—John R. Lee
*Assistant Examiner*—Bernard E. Souw
(74) *Attorney, Agent, or Firm*—Patterson & Sheridan, LLP

(57) ABSTRACT

The invention provides a deflecting system for deflecting a charged particle beam from a first direction to a second direction, the deflecting system comprising a first deflector for deflecting said charged particle beam off the first direction within a first deflection plane; a second deflector for deflecting the deflected charged particle beam into the second direction within the first deflection plane; and at least one deflecting pair of correcting coils comprising two correction coils which is positioned and shaped to reduce an astigmatism of the charged particle beam caused by the deflections.

43 Claims, 20 Drawing Sheets

U.S. PATENT DOCUMENTS

| | | | |
|---|---|---|---|
| 6,222,197 B1 | 4/2001 | Kojima | |
| 6,337,485 B1 * | 1/2002 | Muraki | 250/492.2 |
| 6,472,672 B1 * | 10/2002 | Muraki | 250/492.2 |
| 6,489,620 B1 | 12/2002 | Kamijo | |
| 6,774,379 B1 * | 8/2004 | Hashimoto | 250/492.22 |
| 6,777,697 B1 * | 8/2004 | Yui et al. | 250/492.22 |
| 2002/0024021 A1 | 2/2002 | Iwabuchi et al. | |
| 2002/0089333 A1 | 7/2002 | Wallmark | |
| 2002/0179855 A1 * | 12/2002 | Muraki | 250/492.22 |
| 2005/0012050 A1 * | 1/2005 | Shemesh | 250/491.1 |
| 2005/0035292 A1 * | 2/2005 | Adamec et al. | 250/310 |

OTHER PUBLICATIONS

P.W. Hawkes et al., "Deflection Systems and Their Aberrations,"*Principles of ElectronOptics*,Academic Press 1989 vol.2, Chapter 32: pp. 483-521.

H. C. Chu et al., "Numerical Analysis of Electron Beam Lithography Systems. Part III: Calculation of the Optical Properties of Electron Focusing Systems and Dual-Channel Deflection Systems with Combined Magnetic and Electrostatic Fields," *Optik*. 1982 vol. 61(2): pp. 121-145.

E. Kasper, "Theoretische Elektronrnoptik," Universität tübingen, 1978/1979.

* cited by examiner

CHARGED PARTICLE DEFLECTING SYSTEM

CROSS-REFERENCE TO RELATED APPLICATIONS

This application claims foreign priority benefits under 35 U.S.C. §119 to co-pending European patent application number 03013848.1, filed Jun. 18, 2003. This related patent application is herein incorporated by reference in its entirety.

BACKGROUND OF THE INVENTION

1. Field of the Invention

The invention relates to a deflecting system for deflecting a charged particle beam whereby the deflecting system comprises at least two deflectors. The invention further relates to a charged particle beam device comprising a deflecting system to separate the charged particle beam from secondary charged particles.

2. Description of the Related Art

Charged particle beam devices like electron beam microscopes or electron beam pattern generators use charged particle beams to probe or structure a specimen with high spatial resolution. For the high spatial resolution, the charged particle beam has to be directed and focused with high precision to the position on the specimen that is to be probed or structured. The forming of the charged particle beam is usually performed by electric or magnetic lenses and apertures. For directing a charged particle beam, deflectors are used which use electric or magnetic dipole fields to control deflections of the charged particle beam from a first direction to a second direction.

Unfortunately, deflections of charged particle beams are known to introduce an astigmatism to a charged particle beam. Astigmatism of a beam optical device causes a focused charged particle beam with a previously circular beam cross section to become deformed to an ellipsoidal shaped cross section. The ellipsoidal shaped cross section is the result of a projection where the focusing length in a first plane along the beam axis (sagittal plane) different from the focusing length in a second plane along the beam axis (meridional plane) which is vertical to the first plane. The size of an astigmatism is usually expressed by the difference between the two focusing lengths of the charged particle beam. Alternatively, the size of an astigmatism can be expressed by the diameter of the beam spot of the charged particle beam at a position where the focus is circular (circle of least confusion), i.e. where the focus size of the first plane equals the focus size of the second plane. More details about how deflectors introduce astigmatism are described, for example, in P. W. Hawkes and E. Kasper: *"Principles of Electron Optics"* Vol. 1, Chapter 32, pp. 483–521 and Vol. 2, Chapter 40, pp. 823–854, Academic Press 1989.

Astigmatism is problematic for a high spatial resolution operation, since the probing area of an astigmatic deformed beam is larger than the probing area of the previously circular cross section of the beam. This worsens the achievable spatial resolution. Even worse, astigmatism may accumulate with each deflection which for a beam optical design limits the number of deflections as well as the maximum deflection angles to meet given spatial resolution requirements.

Astigmatism, therefore, is a severe problem for charged particle beam devices where the primary charged particle beam is experiencing several deflections in a row, such as, for example, in a scanning electron microscope (SEM) where magnetic deflectors are used as separators to separate the primary charged particle beam from the beam of secondary charged particles generated by the primary charged particle beam on the specimen. An example for such a deflecting system can be found in the international patent application WO99/26272. The separation of the primary charged particle beam particles from the secondary charged particles is based on the fact that they enter the magnetic deflector from opposite directions. Since the Lorenz-Force of the magnetic field depends on the direction of the incoming charged particles, both beams are deflected in opposite directions. This way, it is possible to detect the secondary charged particles with a detector which is not in the way of the primary charged particle beam.

However, after separating the primary charged particle beam from the secondary charged particles, it is usually preferred that the primary charged particle beam is redirected back onto the optical axis of the beam optical system. Therefore, at least two, and, in most cases, at least three or four deflectors are used.

The advantage of a four stage deflection system that the deflections necessary to return the primary charged particle beam back onto the optical beam axis can be distributed over four deflections having the same deflection angles. Having the same deflection angles allows for a use of the same deflection coils and the same coil current which simplifies the beam optical design considerably. However, the more deflecting stages the deflection system has, the larger the astigmatism accumulated over the various deflection stages.

Astigmatism becomes even more a problem when a charged particle beam device comprises a two-dimensional deflecting system consisting of two deflecting systems which deflect the charged particle beam within two different deflection planes, e.g. within the orthogonal X-plane and Y-planes. With a two-dimensional deflecting system, the primary charged particle beam and the secondary charged particles can be deflected within the X-plane, within the Y-plane and within any plane in between depending on the relative deflecting forces of the two deflecting systems. A two-dimensional deflecting system useful because it makes it possible to switch between different deflection planes to ensure that the secondary charged particles, for each scanning point, are directed to different directions and, possibly, to different detectors. This way, a specimen can be analyzed in parallel with different detectors which can greatly improve the diagnosis capabilities of a charged particle beam device.

However, a two-dimensional deflecting system comprises twice as many deflectors as a comparable one-dimensional deflecting system. Therefore, the astigmatism of a two-dimensional deflecting system, depending on the relative deflecting forces of the two deflecting systems, is significantly increased.

SUMMARY OF THE INVENTION

The present invention is intended to provide an improved deflecting system which does not show the above disadvantages.

In particular, the present invention is intended to provide a deflecting system which keeps the astigmatism of the charged particle beam low despite the at least two deflections. A low astigmatism helps to reduce the beam spot size of the charged particle beam and, therefore, improves the spatial resolution of a probing or structuring charged particle beam device.

Further, the present invention is intended to provide a deflecting system which is capable of deflecting the charged particle beam and reducing the astigmatism to save space and costs, and which makes complicated beam correctors, e.g. like an stigmator, obsolete.

Further advantages, features, aspects, and details of the invention are evident from the dependent claims, the description and the accompanying drawings. The claims are intended to be understood as a first non-limiting approach of defining the invention in general terms.

The invention according to one embodiment provides a deflecting system for deflecting a charged particle beam from a first direction to a second direction whereby the astigmatism caused by the deflections is reduced by a deflecting pair of correcting coils. A deflecting pair of correcting coils is a pair of coils which is capable of generating a magnetic dipole field and a magnetic hexapole field by means of a correcting current $I_c$ passing through the coils. Preferably, the magnetic dipole field and the magnetic hexapole field are generated at the same time. Even more preferred, the deflecting pair of correcting coils is capable of generating the magnetic dipole field and the magnetic hexapole field by means of the same correcting current $I_c$ passing through the two correcting coils.

The invention is based on the recognition that a pair of coils can be used to generate a magnetic dipole field to deflect a charged particle beam, and, at the same time, to generate a magnetic hexapole field to correct astigmatism of the charged particle beam. The invention is further based on the recognition that a combination of a deflector with a deflecting pair of correcting coils can be used to adjust an astigmatism and a deflection angle of a charged particle beam independently from each other; this way, the correcting current $I_C$ through the deflecting pair of correcting coils can be optimized to minimize the astigmatism of a beam while at the same time, the second deflector is adjusted to keep the direction of the charged particle beam constant after it has left the deflecting pair of correcting coils. In this case, deflection angle changes due to changes of the correcting current $I_c$ to minimize astigmatism are compensated for by an according adjustment of the deflection angle of the deflector.

It is preferred that the second deflector can be adjusted to ensure that the charged particle beam is directed into the second direction after having passed through the at least one preferably all deflecting pairs of correcting coils of the deflecting system. Further, preferably, the deflection angle of the second deflector is adjustable to ensure that the charged particle beam is directed into the second direction independently of changes of the currents $I_C$ of the deflecting pairs of correcting coils. This way, it is ensured that the currents $I_c$ of the at least one deflecting pairs of correcting coils can be optimized to minimize astigmatism while at the same time, the second direction is maintained when the charged particle beam leaves the deflecting system.

Preferably, the second direction is a predetermined direction to direct the charged particle beam to a position where it is needed, e.g. for the inspection or structuring of a specimen. Preferably, the second direction defines the direction of the charged particle beam when it leaves the deflecting system. In one preferred embodiment of the invention, the second direction is constant over time. In this case, it is preferred that the operational parameters of the deflectors are adjusted for each change of a correcting current $I_c$ to ensure that the charged particle beam leaves the deflecting $_{system1}$ n the predetermined second direction.

In another preferred embodiment, the predetermined direction varies over time. In this case, it is preferred that the operational parameters of the deflectors are adjusted to direct the charged particle beam into the varied second directions, while at the same time the correcting currents $I_c$ are adjusted to minimize the astigmatism caused by the new deflections.

The use of deflecting pairs of correcting coils facilitates a beam optical design where a deflector is combined with a deflecting pair of correcting coils to form a corrected deflector. For a corrected deflector, the deflector and the corresponding deflecting pair of correcting coils are positioned with respect to each other in a way which ensures that the deflecting field of the deflecting pair of correcting coils substantially overlaps with the deflecting field of the deflector. To do this, it is preferred that the deflector is nested within the deflecting pair of correcting coils or vice versa. The nesting ensures a compact design where the field of the deflector substantially overlaps with the magnetic field of the deflecting pair of correcting coils. The nesting also makes it possible that the point of deflection of the deflector is at the same position as the point of deflection of the deflecting pair of correcting coils.

With a corrected deflector, astigmatism correction and deflecting angle can be adjusted independently from each other by independently adjusting, e.g. the deflecting current $I_D$ of the deflector and the correcting current $I_c$ of the deflecting pair of correcting coils. With a corrected deflector, astigmatism can be suppressed at the location where the deflector is, i.e. where astigmatism is generated, which simplifies the operation of complex beam optical systems. This is a more robust and cost-saving approach for correcting astigmatism than correcting astigmatism of several deflectors globally with e.g. an octupole stigmator.

The sizes of the magnetic dipole field and the magnetic hexapole field of a deflecting pair of correcting coils depend on the shapes of the two coils of which the deflecting pair of correcting coils is formed, the respective positions and orientation of the two coils to each other, and the current (i.e. the correcting current Ic) passing through the two coils.

In one preferred embodiment of the invention, the correcting coils of the at least one of the deflecting pairs of correcting coils are saddle-like coils having an opening angle which deviates from 120 degrees by more than 10 degrees, preferably by more than 30 degrees and even more preferred by more than 50 degrees. The more the opening angle deviates from 120 degrees, the larger the hexapole component of the saddle-like correcting coils to correct an astigmatism effectively. Generally, for a deflection within one deflection plane, it is preferred that the opening angles of the saddle-like coils of the deflecting pair of correcting coils are larger than 120 degrees, since in this case the hexapole component is negative. In this case, in order to reduce astigmatism the deflecting dipole field of the deflecting pair of correcting coils bends a charged particle beam into the same direction as the deflector does. This prevents the magnetic field of the deflector and the deflecting pair of correcting coils from working against each other.

In another preferred embodiment, the correcting coils of at least one of the deflecting pairs of correcting coils are toroidal correcting coils having an opening angle which deviates from 60 degrees by more than 10 degrees, preferably by more than 30 degrees and even more preferred by more than 50 degrees. The more the opening angle deviates from 60 degrees, the larger the hexapole component of the toroidal correcting coils to correct an astigmatism effectively. Further, in a preferred embodiment of the invention, at least one of the pairs of saddle-like coils of the deflecting system according to the invention is replaced by a pair of toroidal coils. Preferably, the opening angle of the toroidal coils $\alpha_T$ related to the opening angle of the replaced saddle-like coils as by the relation $\alpha_T=180°-\alpha_S$.

The invention further includes a deflecting system according to another embodiment having at least one magnetic deflector formed of a pair of saddle-like deflecting coils having an opening angle between 121 degrees and 124 degrees and preferably between 122 degrees and 23 degrees. The invention is based on the idea to adjust the opening angle of a pair of saddle-like coils to a value which ensures that the strength of the hexapole field of the pair of saddle-like coils compensates the astigmatism caused by the deflection. It thereby has been found out that an increase of the coil current of such pair of saddle-like correcting coils provides that the astigmatism correction is carried out independently from the deflection angle. Such pair of saddle-like deflecting coils therefore can be used to replace the more complicated set-up of a corrected deflector. In addition, no adjustment of the astigmatism correction is needed during operation. This greatly simplifies the design of deflecting systems with multiple deflectors.

The invention further includes a deflecting system according to another embodiment, whereby at least one of the magnetic deflectors is formed of a pair of toroidal coils having an opening angle between 56 degrees and 59 degrees and preferably between 57 degrees and 58 degrees. Again, the invention is based on the idea to adjust the opening angle of a pair of coils to a value at which the hexapole field compensates the astigmatism caused by the deflection by the dipole field of the toroidal coils. The invention takes further advantage of the discovery that at an opening angle between 57 degrees and 58 degrees, the hexapole field of a pair of toroidal coils is of the size where the astigmatism caused by the deflection by the dipole field of the pair of toroidal coils is considerably reduced. Again, it has been found that the astigmatism compensating effect is independent of the deflection angle. The pair of toroidal coils therefore can be used to replace the more complicated set-up of corrected deflectors, and no adjustment of the astigmatism correction is needed during operation.

The invention further includes a two-dimensional deflecting according to another embodiment to deflect the charged particle beam within a first deflection plane, within a second deflection plane and/or within any plane in between. With the two-dimensional deflecting system, it is possible, e.g., to deflect the secondary charged particles coming from a specimen into different directions to, e.g., different detectors.

According to this embodiment, the two-dimensional deflecting system comprises a first deflecting system to deflect the secondary charged particles into the second direction within a first deflection plane, and a second deflection system to deflect the charged particle beam into a third direction within a second deflection plane. Preferably, the first deflection plane and the second deflection plane are essentially orthogonal with respect to each other. Further, preferably, the second direction and the third direction are essentially the same. In a preferred embodiment, the first deflecting $_{system\ 1}$s equal to the second deflecting system except for the orientation of the two deflecting systems with respect to each other. This way, it is possible to change from one deflection plane to the other by activating one of the two deflecting systems and deactivating the other, and vice versa. This greatly simplifies the operation of the two-dimensional deflecting system. However, when both deflecting systems are active, the astigmatism caused by the two deflecting systems adds up and the probing size of the charged particle beam becomes large.

In another preferred embodiment, the first deflecting system is equal to the second deflecting system except for the orientation of the two deflecting systems with respect to each other, and except for the deflecting pairs of correcting coils. In this case, it is preferred that the deflecting pairs of correcting coils of the first deflecting system generate a magnetic hexapole field opposite the magnetic hexapole field generated by the deflecting pair of correcting coils of the second deflecting system. This, for example, can be achieved by using saddle-like correcting coils having an opening angle larger than 120 degrees for the first deflecting system, and saddle-like correcting coils having an opening angle smaller than 120 degrees for the second deflecting system. With opposing hexapole fields of the first deflecting system and the second deflecting system, the astigmatism generated by the two-dimensional deflecting system can be reduced for any deflection within any deflection plane into any direction. This way, both deflecting systems can be activated at the same time, and the astigmatism generated by the two deflecting systems can he corrected by the two deflecting pair of correcting coils to essentially cancel the astigmatism.

The invention further includes a charged particle beam device according to another embodiment comprising a charged particle beam source to generate a charged particle beam and a deflector according to any one of the previous claims. The charged particles may be electrons or ions. However, preferably, the charged particle beam device is an electron beam device, preferably an electron beam microscope, and even more preferred a scanning electron microscope (SEM). The charged particle beam source may be a thermionic or a field emission type emitter.

Preferably, the charged particle beam device includes a high voltage beam tube surrounding the charged particle beam to protect the charged particle beam from external electric fields on its way from the charged particle beam source to a specimen. The high voltage beam tube is also known as "liner tube". Preferably, the liner tube is at a high voltage with respect to the specimen and/or with respect to the charged particle beam source (say more than 1000 V) in order to accelerate the charged particles beam and/or the secondary charged particles coming from the specimen to a high voltage. With the secondary charged particles and the primary charged particles directed in opposite directions, the two can be spatially separated by the deflecting system according to the invention without using additional beam optical components. This greatly simplifies the beam optics and reduces the interference of the primary charged particle beam by beam optical components used for the guidance of the secondary charged particles to the detector.

BRIEF DESCRIPTION OF THE DRAWINGS

In the following, the invention is described with respect to preferred examples and with respect to the accompanying drawings which will be explained below in further detail. The drawings thereby schematically show:

FIG. 10b is a beam spot diagram of a charged particle beam deflected by the two-dimensional deflecting system of FIG. 8a where the two-dimensional corrected deflector of FIG. 8b is replaced by the two-dimensional corrected deflector of FIG. 10a.

DETAILED DESCRIPTION OF THE PREFERRED EMBODIMENT

The deflecting system 1 according to one embodiment of the invention includes at least two of the deflectors D1, D2, D3, D4. The deflectors can the any device which is capable of changing the direction of the charged particle beam 3. Preferably, the deflectors D1, D2; D3 and D4 are either electric deflectors, magnetic deflectors or a combination of the two. If a deflector D1, D2, D3, D4 is an electric deflector, the deflector usually comprises a pair of electrodes with the two electrodes having two different voltages to generate a deflecting electric dipole field between the two electrodes. If a deflector D1, D2, D3, D4 is a magnetic deflector, the deflector usually comprises a pair of deflecting coils 50 which is provided with a deflecting current I~ to generate a deflecting magnetic dipole field between the two coils. For the sake of simplicity, the description below will concentrate on magnetic deflectors without limiting the scope of the invention.

Figure 1A:
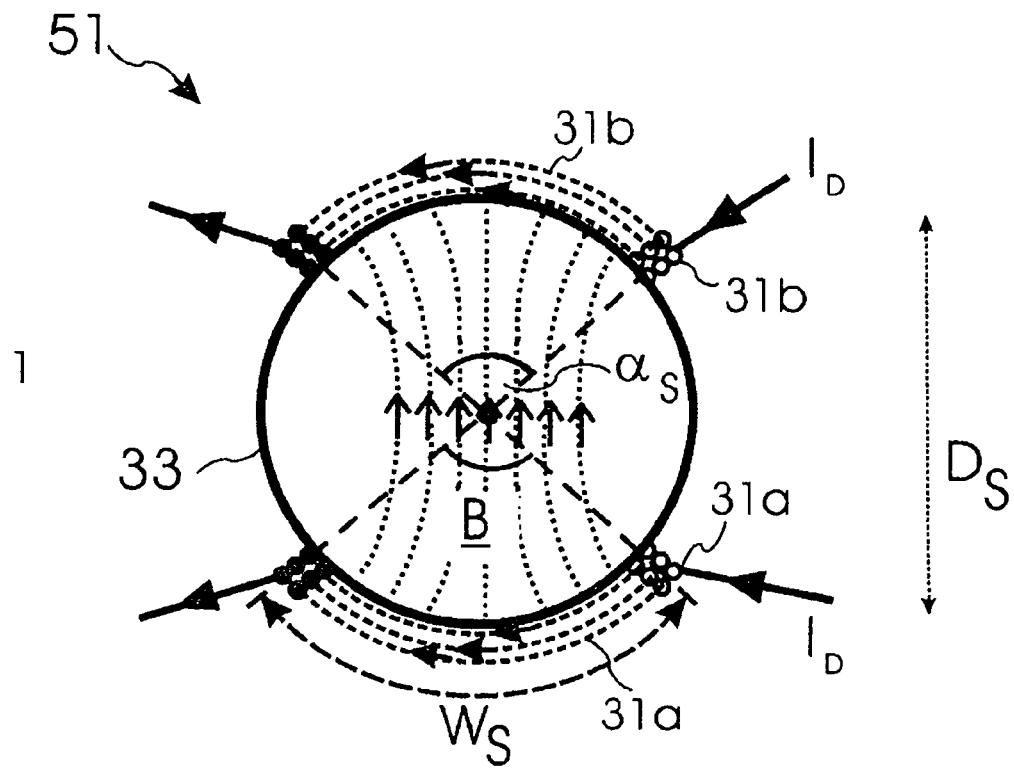
FIGS. 1a–b illustrate two orthogonal cross sections through a pair of saddle-like coils.
Figure 1B:
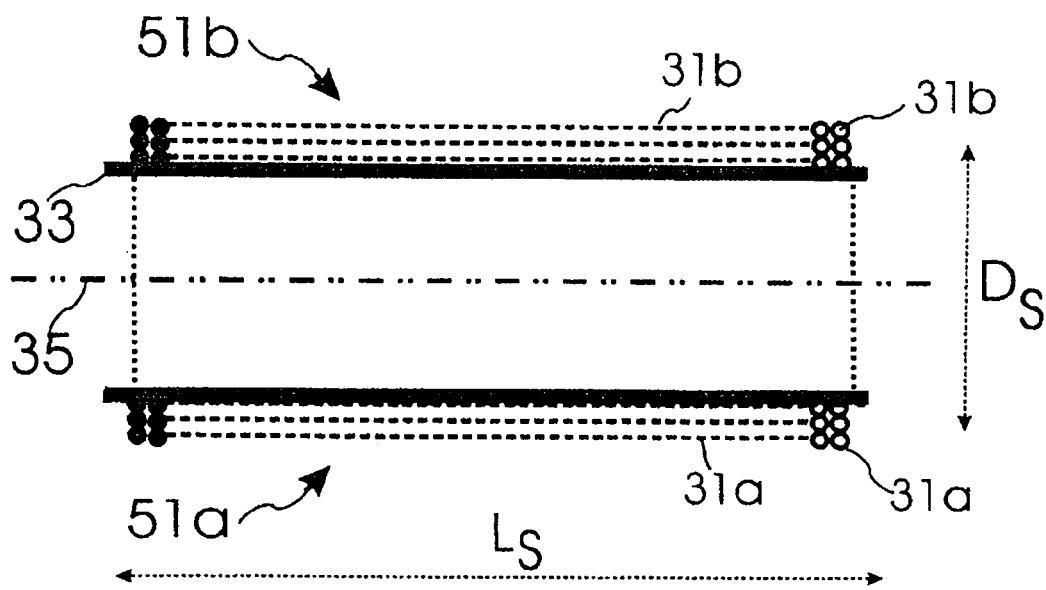
Figure 3A:
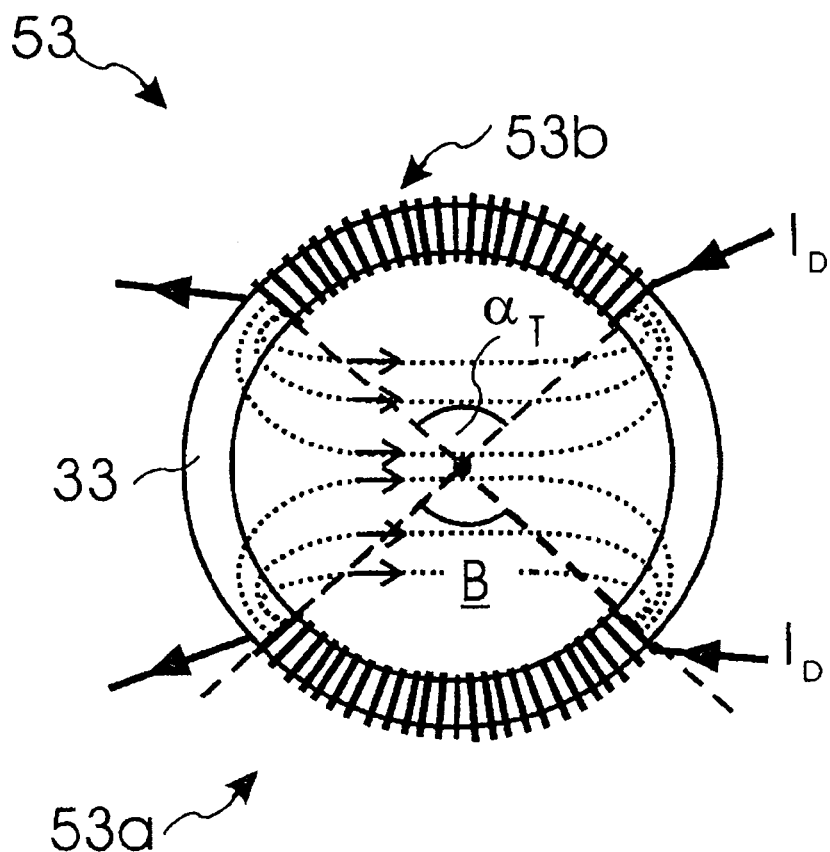
FIGS. 3a–b illustrate two orthogonal a cross sections through a pair of toroidal coils.
Figure 3B:
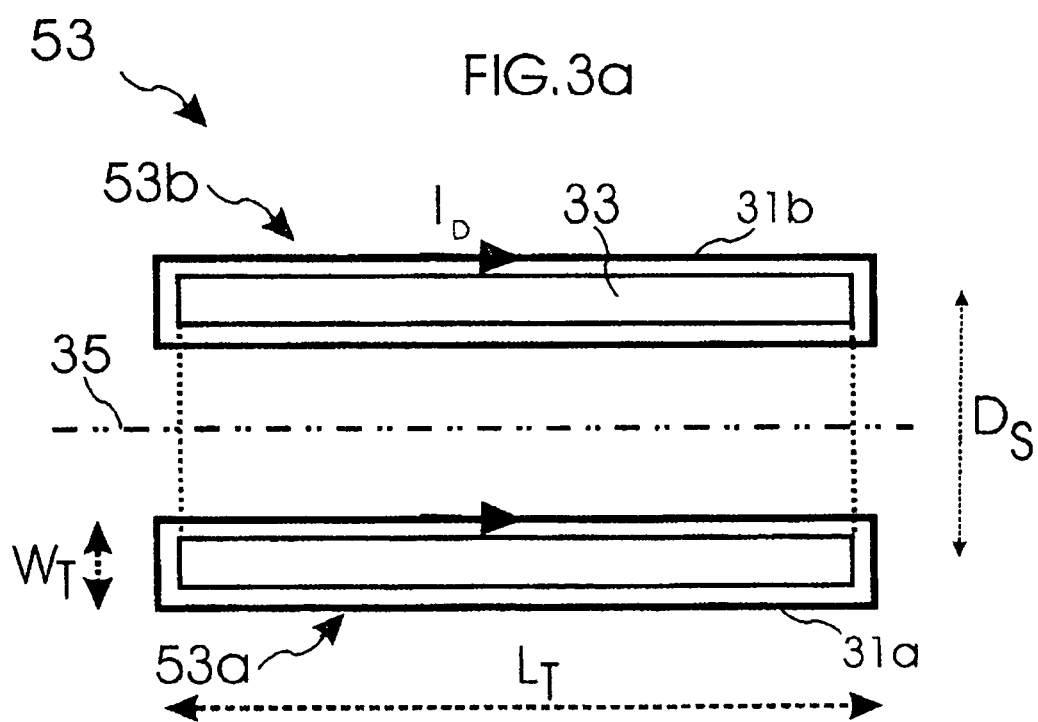

If a deflector D1, D2, D3, D4 is a magnetic deflector, it preferably comprises either a pair of saddle-like deflecting coils 51, 51a, 51b, (shown in FIGS. 1a–1d) or a pair of toroidal deflecting coils 53, 53a, 53b (shown in FIGS. 3a–b). FIG. 1a and b show schematically two orthogonal cross sections through a pair of saddle-like deflecting coils 51. Generally, designs of saddle-like coils are known to persons skilled in the art. A pair of saddle-like coils 51 comprises two saddle-like coils 51a, 51b having windings 31a, 31b which each form a loop with a loop length $L_S$ and a loop width $W_S$ around a cylindrically formed structure 33. With a current running through the two loops, a magnetic dipole field, B, is generated between the two loops which has an essentially vertical direction with respect to the two planes the two loops. The term "saddle-like" refers to the way in which the loops are laid on the surface of a segment of the cylindrically formed structure 33, like a "saddle on a horse back". Preferably, the loops of saddle-like coils are essentially coaxial with the axis of the cylindrically formed structure.

In this context, it should be mentioned that the term "cylindrically formed structure" is to be understood in a broad sense, i.e. it refers to any structure which is coaxial with respect to an axis 35 and which preferably has a given cylindrical length For example, the cylindrically formed structure 33 may be a cylinder as shown in FIGS. 1a and b, a cone-like structure, a shell-like shape like e.g. the saddle coils of a TV or any shape combining those elements.

It should further be mentioned that the term "cylindrical formed structure" also refers to a rectangular parallelepiped where the length of the parallelepiped corresponds to the length of a cylinder, and the faces perpendicular to the length of the parallelepiped correspond to the base plane and top plane of the cylinder. Saddle-like or toroidal wound coils wound on a parallelepipedian structure result in a "flat" pair of coils which are much easier to manufacture than cylindrical coils since the windings are wound within a flat plane instead of on a rounded surface. Further, a flat plane design makes it possible to wind each coil of the pair of coils separately, and later position the coils as a pair. Pairs of flat coils therefore are often used as a replacement for pairs of saddle-like or toroidal coils wound on a cylindrical formed structure.

Figure 1C:
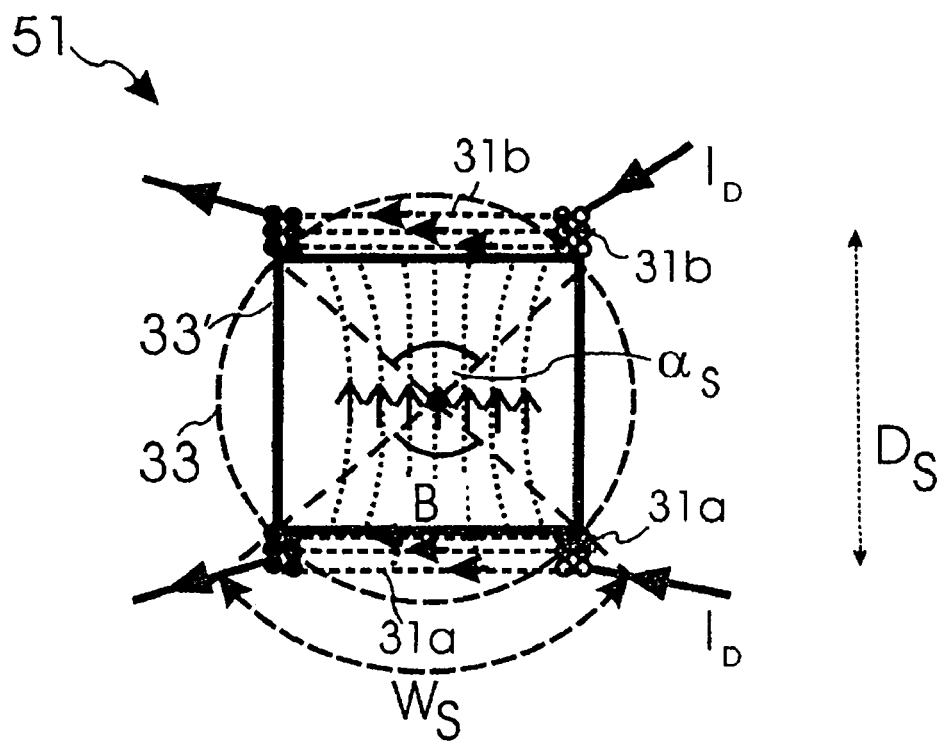
FIGS. 1c–d illustrate cross sections through a pair of saddle-like coils with flat coils with a parallelepipedian structure (b), and without a parallelepipedian structure (c)

FIG. 1c illustrates a pair of flat saddle-like coils 51 wound on a cylindrically formed structure 33' that has the shape of a rectangular parallelepiped. The definitions of the opening angle as, the loop with Ws and loop length $L_S$ are the same as in FIGS. 1a and 1b. For a better understanding, the shape of the cylindrical formed structure 33 of FIG. 1a has been drawn into FIG. 1c with dashed lines.

The hexapole field of a pair of flat saddle-like coils acting on a charged particle beam can be made the same as that of a cylindric pair of saddle-like coils by adjusting the coil currents accordingly. Therefore, any flat pair of saddle-like coils can always be used as a replacement for a cylindrical pair of saddle-like coils. The same holds true when a pair of toroidal coils is wound on a vertical parallelepipedian cylindrical formed structure.

Figure 1D:
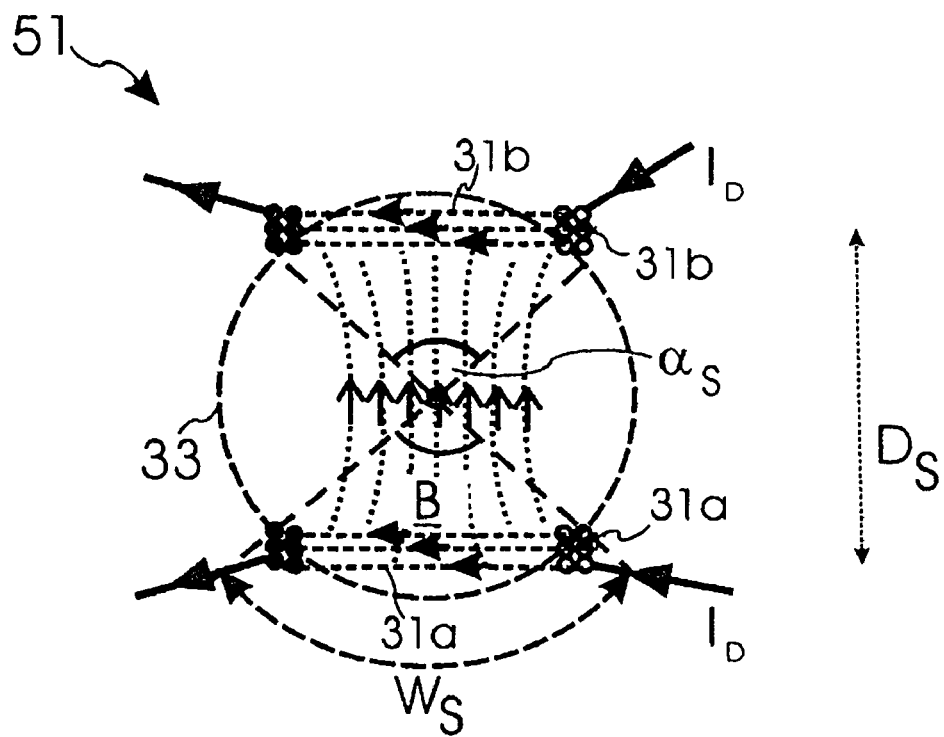

It should further be noted that the cylindrically formed structure 33 may or may not be present in the actual design of the pair of coils. In the latter case, the cylindrically formed structure 33 merely serves as a means to define the geometrical shape and position of the loops of saddle-like coils. If the cylindrically formed structure 33 is not present, the coils are usually referred to as "air coils". An example of a pair of air coils is shown in FIG. 1d. In the case of FIG. 1d, the air coils are flat coils the same as shown in FIG. 1c. Of course, any pair of flat coils and/or air coils can be manufactured as a pair of toroidal coils as well.

Usually, however, a cylindrically formed structure 33 is present for holding the coils in position, for providing a yoke to bundle the magnetic field lines generated by the windings of the coils 31, or simply for shielding the region within the cylindrically formed structure 33 from external electric fields. Further, some or all of the windings of the saddle-like coils may be distributed throughout the loop area defined by the loop length $L_S$ and the loop width $W_S$. Various types of windings 31a, 31b of a saddle-like coil are also shown in FIG. 40.13 of P. W. Hawkes and E. Kaper: "*Principles of Electron Optics*" Academic Press 1989, Vol. 2, Chapter 40.

Preferably, the two windings 31a and 31b of a pair of saddle-like coils 51 are essentially equally shaped, have the same number of windings and/or are electrically connected to be supplied with the same current 1. Further, it is preferred that the two windings 31a and 31b of the pair of saddle-like coils 51 are symmetrically positioned with respect to their symmetry plane crossing the axis 35 of the cylindrically formed structure 33. This way, a high symmetry is achieved for the pair of coils which ensures a strong magnetic dipole field compared to higher order magnetic field components. This is advantageous when the pair of saddle-like deflecting coils 51 is designed to deflect a charged particle beam without deforming the shape of the charged particle beam too much.

An important parameter for the ability of the pair of saddle-like deflecting coils 51 to deflect a charged particle beam without deforming the beam is the size of the opening angle $\alpha_S$. The opening angle $\alpha_S$ of a saddle-like coil is defined by the azimuth angle at the axis 35 which defines the loop width $W_S$ at the cylindrically formed structure 33. In other words, the opening angle is given by the relation a $\alpha=2W_S/D_S$.

Figure 2A:
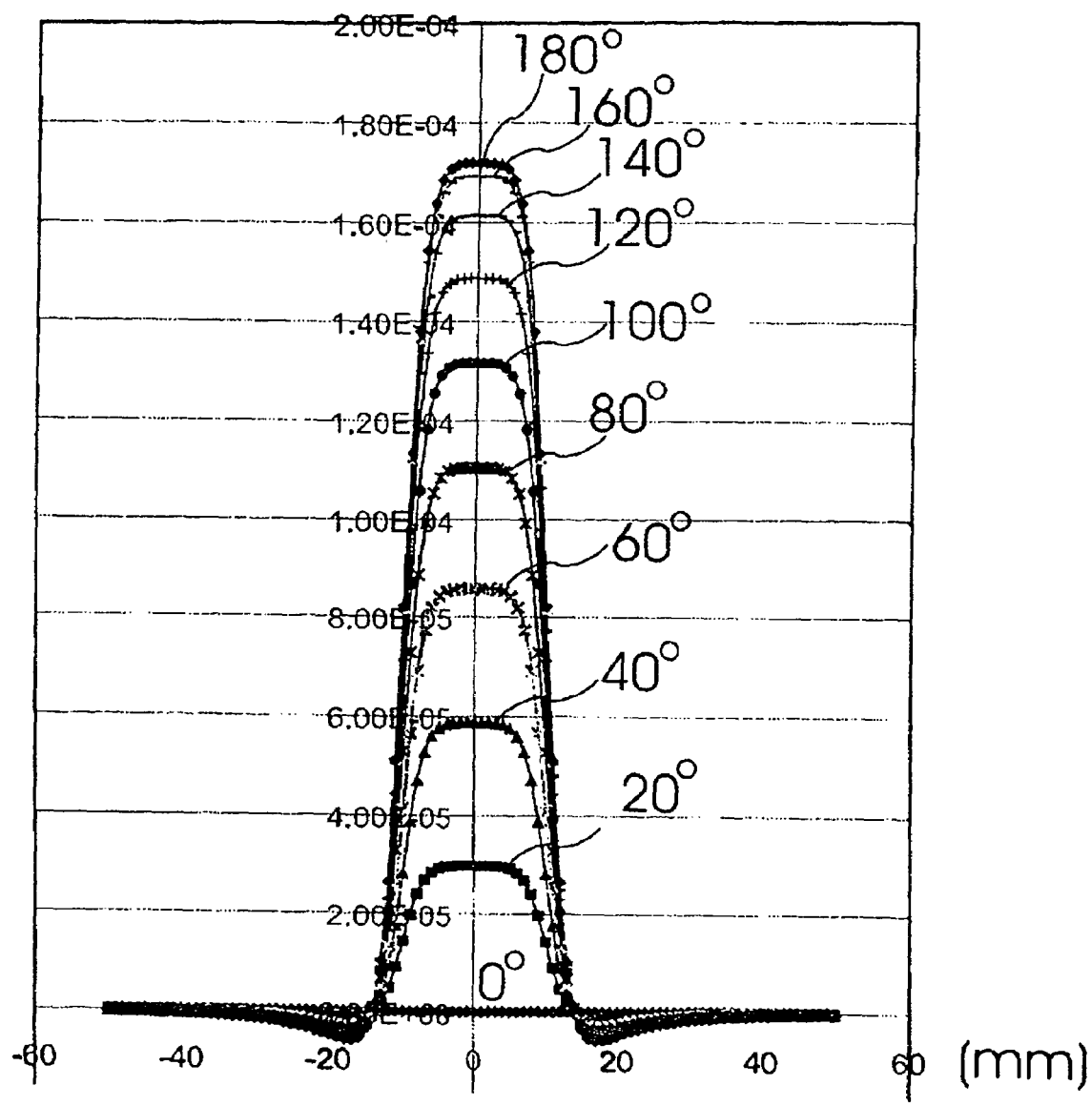
FIG. 2a illustrates magnetic dipole field strengths of pairs of saddle-like coils along their axes for coils having opening angles as of 0, 20, 40, 60, 80, 100, 120, 140 160 and 180 degrees.

In FIG. 2a, the strengths of the magnetic dipole fields of ten pairs of saddle-like coils having ten different opening angles as are drawn along the axis 35. The length $L_s$ of the saddle-like coils along the optical axis 17, in this example, is 20 mm; the inner diameter $D_s$ of the aperture of the pair of coils is 34 mm. As can be seen from FIG. 2a, the maximum magnetic field strength along the axis 35 of a given opening angle $\alpha_s$ is higher the larger the opening angle $\alpha_s$ is. The field strengths, which are given in units of Teslas, reach a maximum value when the opening angle as of the coils is 180 degrees.

Figure 2B:
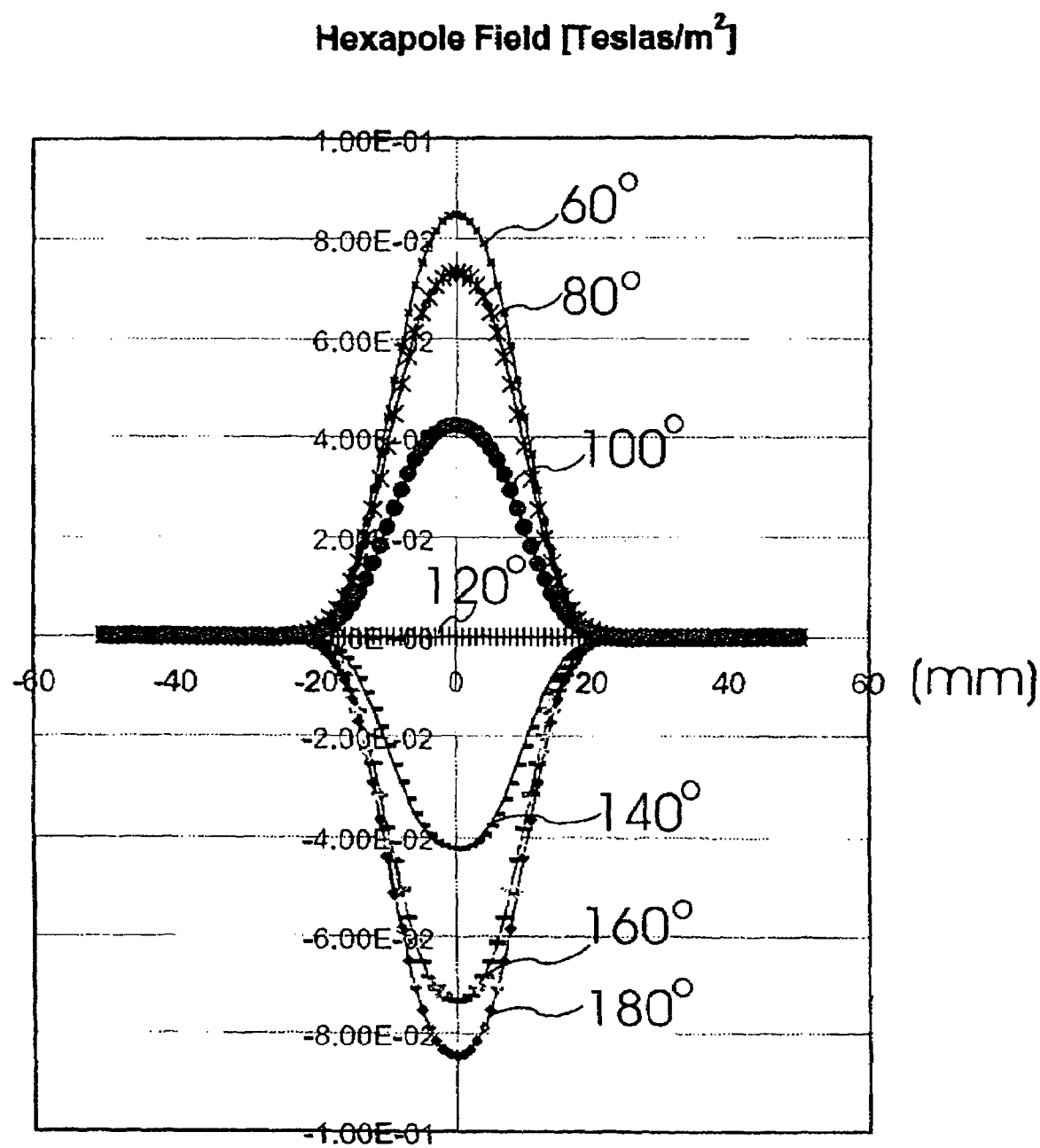
FIG. 2b illustrates magnetic hexapole field strengths of pairs of saddle-like coils along their axes for coils having opening angles $\alpha_s$ of 0, 20, 40, 60, 80, 100, 120, 140 160 and 180 degrees.

In FIG. 2b, the strengths of the magnetic hexapole fields of the same ten pairs of saddle like coils having ten different opening angles as are drawn along the axis 35. The hexapole field strength is given in units of Teslas per square meters. It can be seen from FIG. 2b that the field strengths have negative values if the opening angle as is larger than 120 degrees and positive values when the opening angle $\alpha_S$ is smaller than 120 degrees.

FIG. 2b also discloses that there is no hexapole field when the opening angle as is 120 degrees. Therefore, the pairs of saddle-like deflecting coils 51 of the deflectors D1, D2, D3 and/or D4 have saddle-like coils with opening angles as which are preferably within the range between 80 degrees and 160 degrees, more preferred within the range between 100 degrees and 140 degrees and even more preferred within the range between 115 degrees and 125 degrees. The closer the opening angle is to 120 degrees, the larger the dipole field is relative to the hexapole field to deflect a charged particle beam.

As mentioned above, deflectors may also be formed of a pair of toroidal coils 53 as shown in FIGS. 3a and 3b. A pair of toroidal coils 53 comprises two toroidal coils 53a, 53b having windings 31a, 31b that are wound meridionally around a cylindrically formed structure 33, i.e. in a direction along the axis 33 of the cylindrically formed structure 33. The two windings 31a, 31b therefore each form a loop with a length LT given by the length of the cylindrically formed structure 33 and a width WT given by the thickness of the jacket of the cylindrically formed structure 33. The opening angle $\alpha_T$ of a toroidal coil is defined, like for the saddle-like coils, by the azimuth angle covered by the windings 31a, 31b when seen from the axis 35 of the cylindrically formed structure 33.

As can be seen from a comparison between FIGS. 1a and 3a, toroidal pairs of coils 53 within the axis region 35 can generate magnetic fields which are the same as the magnetic fields of a pair of saddle-like coils 51 when the pair of toroidal coils is rotated by 90 degrees and when the opening angles of the saddle-like coils as and the opening angle of the corresponding toroidal coils $\alpha_T$ obey the relation $\alpha_T=180°-\alpha_S$. For example, the magnetic hexapole moment of a pair of toroidal pair of coils is zero when the opening angle $\alpha_T$ is 60 degrees (rather than 120 degrees for a pair of saddle-like coils), and a maximum hexapole field of a pair of toroidal coils is reached when the opening angle $\alpha_T$ is 120 degrees (rather than 60 degrees for a pair of saddle-like coils. The relation $\alpha_T$–180°, as between the toroidal opening angle $\alpha_T$ and the saddle-like opening angle as can be used to determine the toroidal opening angle $\alpha_T$ that is required to replace a given pair of saddle-like coils in a deflecting system 1.

Therefore, throughout the description, it is within the scope of the invention that any pair of saddle-like coils can be replaced by a pair of toroidal coils with the appropriate opening angle $\alpha_r$ and an appropriate orientation, and vice versa. For example, in a preferred embodiment, one or any of the deflectors D1, D2, D3 and/or D4 may comprise a pair of toroidal coils having an opening angle $a_1$ which is preferably within the range between 100 degrees and 20 degrees, more preferred between 80 degrees and 40 degrees and even more preferred between 65 degrees and 55 degrees. The closer the opening angle $α_T$ to 60 degrees is, the larger the dipole field is relative to the hexapole field to deflect a charged particle beam.

Like for the pair of saddle-like coils, the two windings 31a and 31b of a pair of toroidal coils 53 are preferably equally shaped, have the same number of windings and/or are electrically connected to be supplied with the same current ID. Further, it is preferred that the two windings 31a and 31b of the pair of toroidal coils 53 are symmetrically positioned with respect to a symmetry plane to provide a good symmetry with respect to the deflection plane 5. With a high symmetry, a strong magnetic dipole field compared to higher order magnetic field components is ensured. This is advantageous when the pair of toroidal deflecting coils 53 is designed to deflect a charged particle beam without deforming the shape of the charged particle beam too much. Also, the deflectors according to the invention can be any pair of toroidal coils wound around any cylindrically formed structure 33, as described for the saddle-like coils.

The at least one deflecting pair of correcting coils 7, 8 of the deflecting system 1 according to the invention comprises two correcting coils 7a, 7b, 8a, 8b (shown in FIGS. 6a–6d) which are positioned and shaped to reduce an astigmatism of the charged particle beam.

In one preferred embodiment of the invention, the hexapole field is generated by means of a pair of saddle-like correcting coils 75 The pair of saddle-like correcting coils 75 can be like any of the pairs of saddle-like deflecting coils 51 as described for the deflectors D1, D2, D3, D4 except that opening angles as must be different from 120 degrees. This is because a pair of saddle-like coils with an opening angle of 120 degrees cannot provide a hexapole field component (see FIG. 2b). Further, in order to provide a strong magnetic hexapole field for correcting astigmatism, it is preferred that the saddle-like correcting coils have an opening angle $α_S$ which deviates from 120 degrees by more than 10 degrees, preferably by more than 30 degrees and even more preferred by more than 50 degrees. The more the opening angle deviates from 120 degrees, the larger the hexapole component of the saddle-like correcting coils to correct an astigmatism. With a large deviation from 120 degrees, the current through the correcting coils 75a, 75b, the number of windings N2 of the correcting coils and/or the size of the correcting coils can be kept small.

FIGS. 2a and 2b show that pairs of saddle-like correcting coils 75a, 75b of any opening angle as different from 120 degrees generate a magnetic dipole field and a hexapole field. In order for the pair of saddle-like correcting coils 75 to correct the astigmatism caused by its own deflection due to its magnetic dipole field, it is preferred to have a negative magnetic hexapole field. Therefore, it is preferred for the pair of saddle-like correcting coils 75a,b to have an opening angle as larger than 120 degrees.

An opening angle as larger than 120 degrees is also advantageous in the case when the pair of saddle-like correcting coils 75 is combined with a deflector to generate a deflection independent of the hexapole field. With the opening angle as larger than 120 degrees, the dipole field of the pair of saddle-like correcting coils 75a, 75b deflects a charged particle beam 3 in the same direction as the deflector when the pair of saddle-like correcting coils 75a, 75b is used to reduce the astigmatism. This allows the dipole field of the first deflector D1 to be reduced in order to maintain a constant predetermined first deflection angle $β_1$. It is for these reasons that the opening angle as of the saddle-like correcting coils 75a, 75b is preferably larger than 140 degrees, even more preferred larger than 160 degrees and, if technically feasible, even more preferred larger than 170 degrees.

Like for the deflectors, it is within the scope of the invention to replace any of the pairs of saddle-like correcting coils 75 by a pair of toroidal correcting coils 77 if the according toroidal opening angle $α_T$ has been chosen, i.e. if $α_T=180°−α_S$. Therefore, if a pair of correcting coils is made of a pair of toroidal correcting coils, it is preferred that the opening angle $α_T$ of the pair of toroidal correcting coils 77 deviates from 60 degrees by more than 10 degrees, preferably by more than 30 degrees and even more preferred by more than 50 degrees to provide a large hexapole field. Further, in order to have a negative hexapole component, it is preferred that the toroidal opening angle $α_T$ is smaller than 60 degrees.

Figure 4:
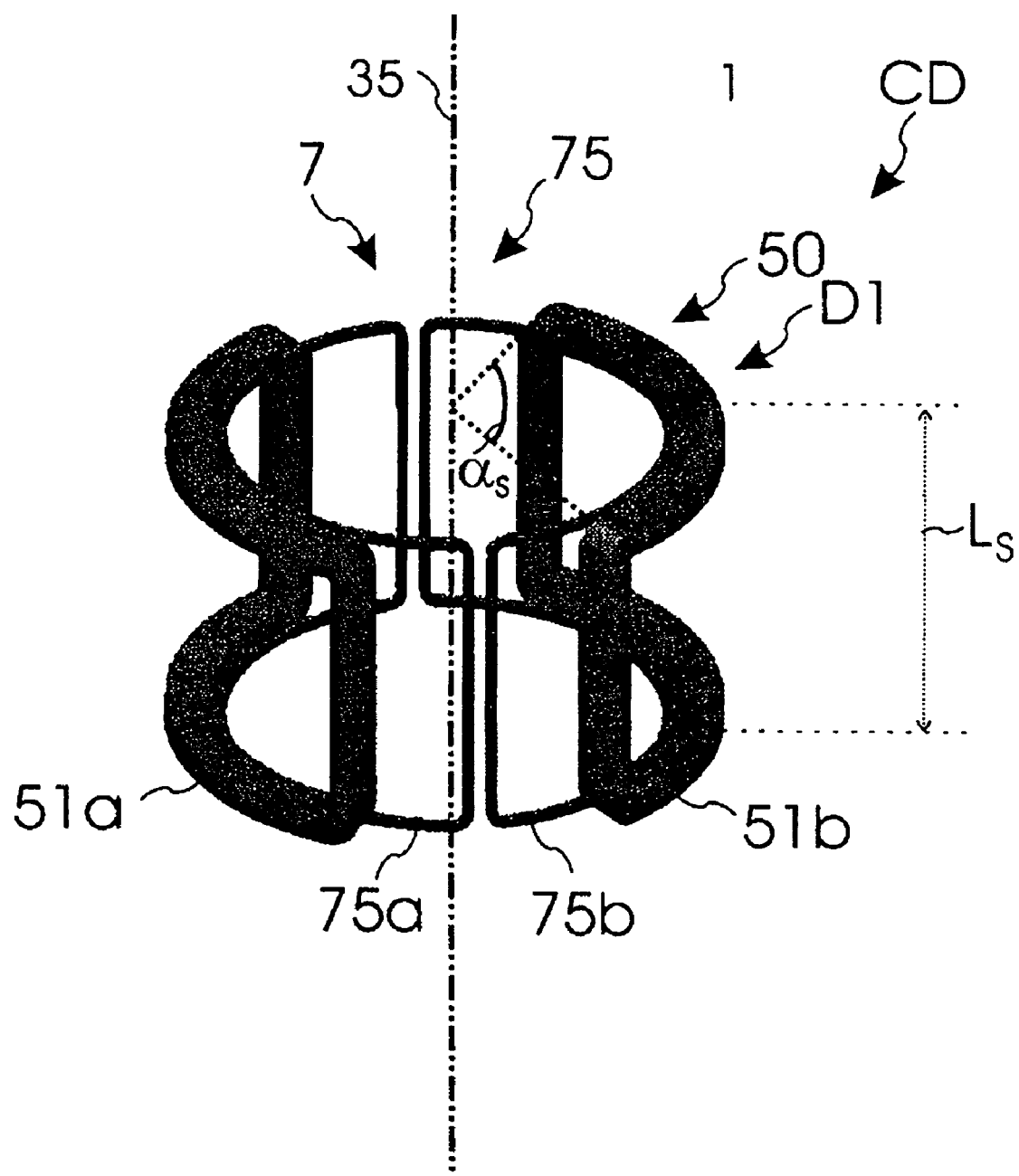
FIG. 4 illustrates schematic three-dimensional view of a corrected deflector having a pair of saddle-like deflecting coils and nested therein a pair of saddle-like correcting coils.

FIG. 4 schematically illustrates a 3-dimensional view of a corrected deflector CD comprised of a deflecting pair of correcting coils 7 and a pair of deflecting coils 50 deflector D1. As used herein, the reference number 7 generically refers to a pair of correcting coils, regardless of the type (e.g., saddle-like 75 or toroidal 77). Similarly, the reference number 50 generally refers to a pair of deflecting coils, regardless of the type (e.g., saddle-like 51 or toroidal 53). The term "corrected deflector" refers to the property that a corrected deflector comprises at least one deflector and at least one deflecting pair of correcting coils. For a corrected deflector CD, it is preferred that the deflector and the deflecting pair of correcting coils 7 are positioned with respect to each other to ensure that then respective points of deflections are close to each other. Further, preferably, the deflector of a corrected deflector is F pair of deflecting coils. This way, the current $I_D$ of the pair of deflecting coils and the current $I_c$ of the deflecting pair of correcting coils can be used to adjust the magnetic dipole field of the pair of deflecting coils and the deflecting pair of correcting coils independently from the hexapole field of the deflecting pair of correcting coils and/or the pair of deflecting coils. The independent adjustment of the dipole field and the hexapole field enables the corrected deflector to deflect the charged particle beam by any deflection angle with a reduced astigmatism compared to the case when the deflecting pair of correcting coils is switched off. This way, the astigmatism can be reduced for any deflection by more than 95%.

The deflector D1 of the corrected deflector CD of FIG. 4 is made of a pair of saddle-like deflecting coils 51 with the saddle-like deflecting coils 51a, 51b to generate a deflecting magnetic field and a deflecting pair of correcting coils 7 comprising a pair 75 of saddle-like correcting coils 75a, 75b to generate a magnetic hexapole field to correct an astigmatism. The saddle-like deflecting coils 51a, 51b can be of any of the types of saddle-like coils as described in the description above. For example, the shape of the pair of saddle-like deflecting coils 51a, 51b can be conic, shell-like or be of any other rotationally symmetric shape. However, it is preferred that two saddle-like deflecting coils 51a, 51b are symmetrically positioned and shaped to each other with respect to a symmetry plane to provide a strong dipole component for deflection. Preferably, the symmetry plane is the deflection plane 5 (see FIGS. 5a–b). It is further preferred that the two saddle-like deflecting coils 51a, 51b each have an opening angle as between 100 degrees and 140 degrees and preferably between 115 degrees and 125 degrees to have a weak or possibly no hexapole field.

The pair of saddle-like correcting coils 75a, 75b, like the pair of saddle-like deflecting coils 52a, 51b, can be any of the pairs of coils described in the description above. For example, the shape of the pair of saddle-like correcting coils 75a, 75b can be conic, shell-like or he of any other rotationally symmetric shape. However, it is also preferred that the two saddle-like correcting coils 75a, 75b are equally shaped and symmetrically positioned to each other with respect to the same deflection plane 5. This way, the deflection of the saddle-like correcting coils 75a, 75b and the deflection of the pair of saddle-like deflecting coils 51a, 51b take place within the same plane which improves the efficiency of the astigmatism correction. However, contrary to the pair of saddle like deflecting coils 51a, 51b, it is preferred have an opening angle as larger than 150 degrees and, if possible, larger than 160 degrees to provide a strong hexapole field at a moderate correction current $I_c$ for correcting the astigmatism.

The pair of saddle-like correcting coils 75a, 75b and the pair of saddle-like deflecting coils 51a, 51b of FIG. 4 are nested within each other to ensure that the point of deflection 21 (see FIGS. 6a–e) of the pair of saddle-like correcting coils 75a, 75b and the point of deflection 21 of the pair of saddle-like deflecting coils 51a, 51b are close to each other. This is important to ensure that a charged particle beam 3 does not change its trajectory when the magnetic field of the pair of saddle-like correcting coils 75a, 75b is adjusted to reduce an astigmatism. Different points of deflection 21 would cause the trajectory of the charged particle beam to change since during a hexapole field adjustment, the dipole field component of the pair of saddle-like correcting coils 75a, 75b would cause a deflection which could not be compensated by an adjustment of the dipole field of the pair of saddle-like deflecting coils 51a, 51b.

Therefore, to obtain a static trajectory of the charged particle beam the distance between the points of deflection 21 of the pair of saddle-like correcting coils 75a, 75b and the pair of saddle-like deflecting coils 51a, 51b is preferably smaller than the loop length $L_S$ of the saddle-like correcting coils 75a, 75b. Preferably, the distance between the two points of deflections 21 is smaller than 1/10 and even more preferred smaller than 1/100 of the loop length of the saddle-like correcting coils 75a, 75b.

Preferably as shown in FIG. 4 the deflecting pair of correcting coils 7 is nested within the pair of saddle-like deflecting coils 51. However, it is within the scope of the invention that the pair of saddle-like deflecting coils 51 is nested within the deflecting pair of correcting coils 7. "Nesting a pair of coils within another pair of coils" refers to the property where the vertical projections of the two pairs of coils onto their respective axis 35 overlap each other at least partially. This way, the pairs of coils can be densely packed in the direction along the trajectory of the charged particle beam. Preferably, one pair of coils is fully nested within the other pair of coils. "Fully nesting" refers to the property where the vertical projection of one pair of coils onto its axis 35 fully covers the projection of the other pair of coils onto the same axis 35, as shown in FIG. 4. As can be seen in FIG. 4, the deflecting pair of saddle-like correcting coils 7 fully nested within the first deflector D1 which is comprised of the two saddle-like deflecting coils 51. With two pairs of coils that are fully nested, an even higher packaging density along the trajectory of the charged particle beam can be achieved. In addition, the points of deflections 21 of the two pairs of coils are positioned even closer.

Generally, the scope of the present invention is not limited by the feature defining whether a first pair of coils is nested within another pair of coils or vice versa. For example, in FIG. 4, the deflecting pair of correcting coils 7 nested within the pair of saddle-like deflecting coils 51. However, the invention also includes a design where the pair of saddle-like deflecting coils 51 is nested within the deflecting pair of correcting coils FIG. 4 illustrates a corrected deflector CD with a pair of saddle-like correcting coils 75a, 75b and a pair of saddle-like deflecting coils 51a, 51b. However, in many cases it is preferred that one or both of the pairs of saddle-like coils of FIG. 4 are replaced by one or two pairs of toroidal coils as shown in the FIG. 5a to 5d. However, if a pair of saddle-like coils is replaced by a pair of toroidal coils, the pair of toroidal coils must be rotated, preferably by as much as 90 degrees within 5 degrees, to provide that the deflecting plane 5 of the pair of saddle-like coils coincides with the deflecting plane of the respective pair of toroidal coils. This is because the dipole field of a pair of saddle-like coils is orthogonal to the symmetry plane of the two coils, while the dipole field of a pair of toroidal coils is parallel to the symmetry plane of the two coils, as can be seen from comparing FIG. 1a with FIG. 3a.

Figure 5A:
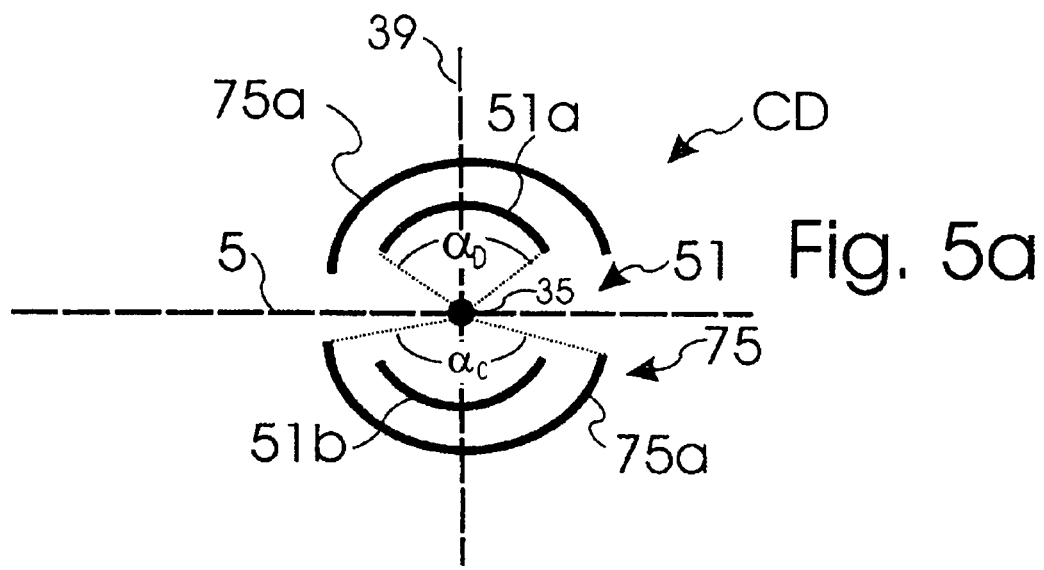
FIG. 5 illustrates schematic cross section through a corrected deflector having a pair of saddle-like correcting coils and nested therein a pair of saddle-like deflecting coils.
FIG. 5b illustrates a schematic cross section through a corrected deflector having a pair of toroidal correcting coils and nested therein a pair of toroidal deflecting coils.
FIG. 5c illustrates a schematic cross section through a connected deflector having a pair of toroidal correcting coils and nested therein a pair of saddle-like deflecting coils.
FIG. 5d illustrates a schematic cross section through a corrected deflector having a pair of toroidal correcting coils and a pair of saddle-like deflecting coils both coaxially aligned with the same radius.

In FIG. 5a, a cross section through a corrected deflector CD as shown in FIG. 4 is disclosed, with the difference that the pair of saddle-like deflecting coils 51a, 51b is nested within the pair of saddle-like correcting coils 75a, 75b. Preferably, the pair of saddle-like deflecting coils 51a, 51b is fully nested within the pair of saddle-like correcting coils 75a, 75b to provide a compact design of a deflecting system 1. The pair of saddle-like deflecting coils 51a, 51b is characterized by its opening angle an which is close to 120 degrees to provide a large magnetic dipole field and, compared to this, a small magnetic hexapole field (see FIGS. 2a and 2b). The pair of saddle-like correcting coils 75a, 75b is characterized by an opening angle $\alpha_c$ which is close to 180 degrees to provide a large negative magnetic hexapole field component (see FIG. 2h). Therefore, the larger the opening angle $\alpha_c$, the smaller the current 1c within the saddle like correcting coils 75a, 75b can be to achieve the same astigmatism correction.

FIG. 5a, like in FIG. 4, also discloses that each of the two pairs of coils is symmetric with respect to the same first deflection plane 5. The deflection plane 5 is represented by the plane within which the corrected deflector CD deflects a charged particle beam which enters the corrected deflector CD along its axis 35. FIG. 5a also discloses that each of the two pairs of coils is symmetric with respect to a second symmetry plane 39 which is orthogonal with respect to the deflection plane 5. This symmetry ensures that higher order magnetic field components which would deform a charged particle beam to a larger spot size are minimized.

Therefore, it is generally preferred that the coils of a pair of deflecting coils 51 positioned to be symmetric with respect to the first deflection plane 5 within a 20 degrees rotation and preferably within a 5 degrees rotation. It is also preferred that the coils (75a, 75b) of the deflecting pair of correcting coils 75 are positioned to be symmetric with respect to the first deflection plane 5 within a 20 degrees rotation and preferably within a 5 degrees rotation. It is further generally preferred that the coils of a pair of deflecting coils 51 are positioned to be symmetric with respect to a second symmetry plane 39 within a 20 degrees rotation and preferably within a 5 degrees rotation. Often a precision to better than 1 degree is required.

It is further preferred that the coils of the deflecting pair of correcting coils 75 are positioned to be symmetric with respect to same second symmetry plane 39 within a 20 degrees rotation, preferably within a 5 degrees rotation and even more preferred within 1 degree rotation. Further, it is preferred that the second symmetry plane 39 is orthogonal with respect to the first deflection plane 5.

Figure 5B:
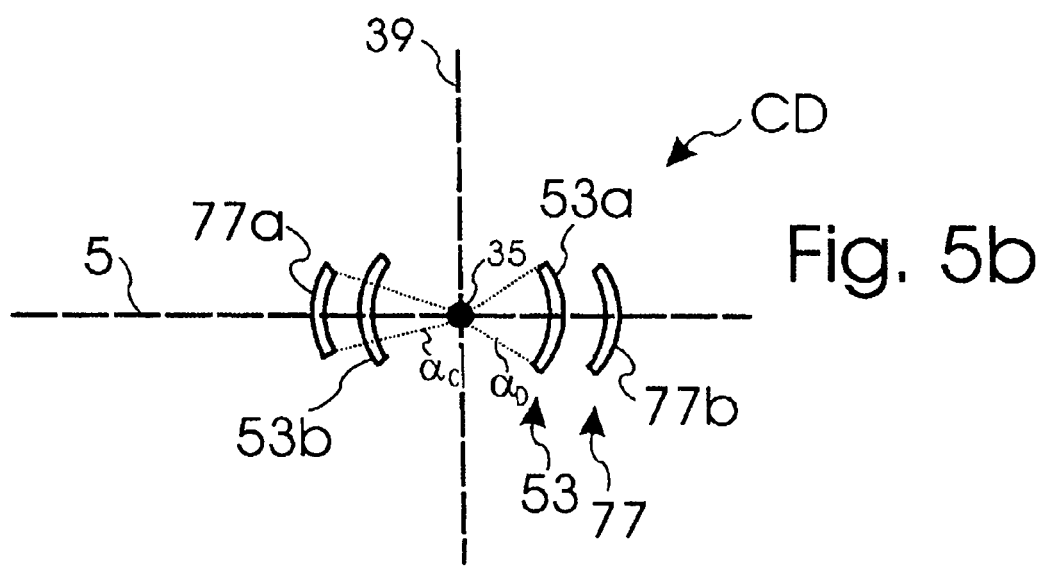

FIG. 5b discloses a corrected deflector CD like in FIG. 5a with the difference that the pair of saddle-like deflecting coils 51 and the pair of saddle-like correcting coils 75 are each replaced by a pair of toroidal deflecting coils 53 (53a, 53b) and a pair of correcting coils 77 (77a 77b), respectively. In addition, to be able to deflect a charged particle beam 3 within the same deflection plane 5, the pair of toroidal deflecting coils 53 (53a, 53b) and the pair of toroidal correcting coils 77 (77a, 77b) are rotated by 90 degrees compared to the pair of saddle-like coils of FIG. 5a.

The coils of the pair of toroidal deflecting coils 53 are characterized by an opening angle $\alpha_D$ which is close to 60 degrees in order to provide a large magnetic dipole field component compared to the hexapole component. This way the magnetic field of the pan of toroidal deflecting coils 53 the region of the axis 17 is similar to the magnetic field of the pair of saddle-like deflecting coils 51 of FIG. 5a since the relation $\alpha_T = 180° - \alpha_S$ between the toroidal opening angle $\alpha_T$ and the saddle-like opening angle $\alpha_T$ is ensured (In FIG. 5a, the opening angle of the coils of the pair of saddle-like deflecting coils 51 is about 120 degrees).

The coils of the pair of toroidal correcting coils 77 are characterized opening angle $\alpha_C$ which is significantly smaller than 60 degrees in order to provide a large negative magnetic hexapole component. This way, the magnetic field of the pair of toroidal correcting coils 77 in the region of the axis 17 is similar to the magnetic field of the pair of saddle-like correcting coils 75 of FIG. 5a, since the relation $\alpha_T = 180° \alpha_S$ between the toroidal opening angle $\alpha_T$ and the saddle-like opening angle $\alpha_S$ is almost ensured (In FIG. 5a, the opening angle of the coils of the pair of saddle like deflecting coils 51 is close to [80 degrees). However, it is difficult to make the opening angle of the $\alpha_T$ too small since in this case the strength of the magnetic field becomes small. Therefore, the opening angle $\alpha_T$ of the coils of the pair of toroidal correcting coils 77 is usually not smaller than 10 degrees.

Figure 5C:
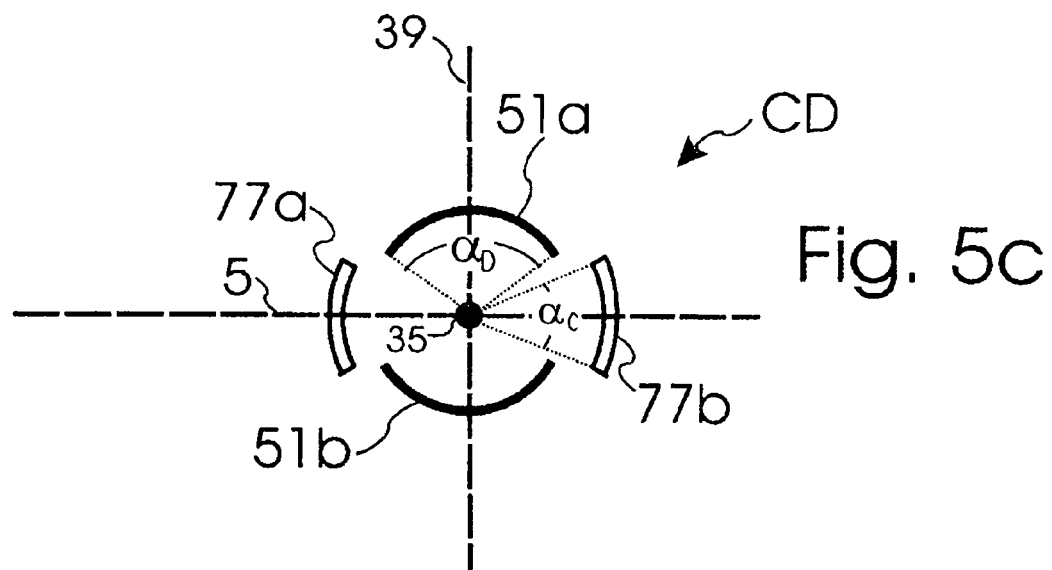

FIG. 5c discloses a corrected deflector CD where a pair of toroidal coils and a pair of saddle-like coils are combined, In FIG. 5c, the pair of deflecting coils 50 is a pair of saddle-like deflecting coils 51a, b like in FIG. 5a, while the deflecting pair of correcting coils 7 is a pair of toroidal correcting coils 77, 77a, 77b like in FIG. 5b. This way, the magnetic field in the region around the axis I 7 can be made the same. Preferably, the pair of saddle-like deflecting coils 51 is fully nested within the pair of toroidal correcting coils 77. Combining toroidal and saddle-like coils can have advantages depending on the application and the space provided for the installation of a deflecting system 1.

Figure 5D:
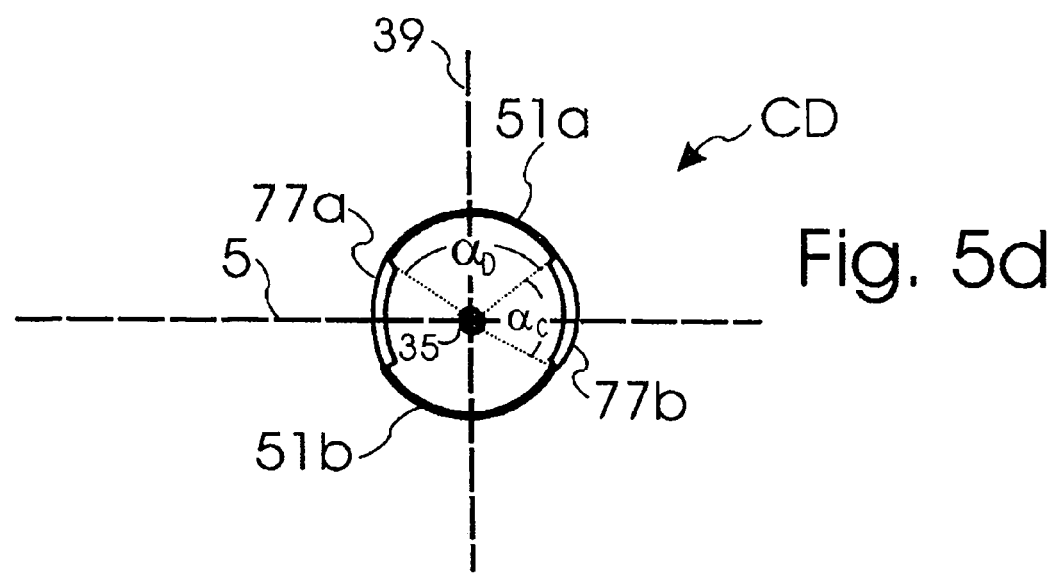

FIG. 5d discloses a corrected deflector CD like in FIG. 5c with the difference that the pair of saddle-like deflecting coils 51 and the pair of toroidal correcting coils 77 have the same radius with respect to the axis 17 of the coils. Such a design is advantageous because it is compact and the coils can be wound on a single cylindrically formed structure 33.

The corrected deflectors CD shown in FIG. 5a to 3d are only a small selection of the possible combinations by which a corrected deflector CD according to the invention can be designed. For example, the order by which one pair of coils is nested within another pair of coils is freely selectable, and is usually chosen according to a given application. Further, it is within the scope of the invention to freely choose whether to take a pair of saddle-like coils or a pair of toroidal coils for the pair of deflecting coils 50 or the deflecting pair of correcting coils 7.

FIG. 6a to 6e schematically illustrate various deflecting systems according to the invention. For the sake of simplicity, the optical axis 17 of the various deflecting systems 1 in the figures is made to coincide with the axis of the incoming charged particle beam 3 which in turn coincides with the first direction 10 of the charged particle beam.

In FIG. 6a to 6e, the deflectors D1, D2, D3 and D4 are symbolized by dashed lines indicating the plane of deflection. The intersection of a dashed line with the charged particle beam 3 further indicates the point of deflection 21 of a given deflector. The point of deflection 21 of a deflector is defined as the position at which the straight line along the line of the incoming charged particle beam 3 intersects with the straight line along the line of the charged particle beam 3 leaving the deflector. It is also the position at which any of the deflection angles $\beta_1$, $\beta_2$, $\beta_3$, $\beta_4$ of the deflectors respective deflectors D1, D2, D3, D4 are measured.

The first deflector D1 is meant to deflect the charged particle beam 3 off the first direction 10 by a first deflection angle $\beta_1$. The second deflector D2 is meant to deflect the charged particle beam 3 by a second deflection angle $\beta_2$ into the second direction 11. In other words, the first deflector D1 is defined to be the first deflector of the deflecting system 1 through which the charged particle beam 3 passes when it enters the deflecting system 1, while the second deflector D2 is the last deflector through which the charged particle beam 3 passes before it leaves the deflecting system 1.

There are several ways to design a deflecting pair of correcting coils having a hexapole field component to correct astigmatism. The deflecting pair of correcting coils 7 preferred for this and the following deflecting systems are pairs of saddle-like correcting coils 75 or pairs of toroidal correcting coils 77 as described above (see e.g. FIG. 1a,b and FIG. 3a,b.) However, the scope of the present invention is not limited to these kinds of pairs of coils. For example, each pair of saddle-like coils can also be replaced by a pair of toroidal coils.

The deflecting pairs of correcting coils 7, 8 in the FIG. 6a to 6e serve to reduce the astigmatism of the charged particle beam 3 to improve the focusing quality of a charged particle beam device. Preferably, the deflecting pans of correcting coils 7, 8 serve to reduce the astigmatism generated by the deflecting system 1. However, the deflecting pairs of correcting coils 7, 8 may also be used to reduce the astigmatism generated from optical devices other than the deflectors of the deflecting system 1.

A reduction of an astigmatism generated by a deflection of the charged particle beam is preferably quantified by the degree by which the diameter of the "circle of least confusion" is reduced. The circle of least confusion is the cross section of the charged particle beam at the position where the focusing size within the sagittal plane equals the focusing size within the meridional plane. For example, a reduction of an astigmatism can be determined by comparing the diameter of the circle of least confusion when the correcting current $I_c$ is switched off with the diameter of the circle of least confusion when the correcting current $I_c$ is switched on. The correcting current $I_c$ is the current that runs through the correcting coils to generate the magnetic field of the pair of correct coils 7.

The deflecting systems 1 of FIG. 6a to FIG. 6e comprise a deflecting pair of correcting coils 7 comprising two correcting coils 7a, 7b which generate a magnetic dipole field to deflect the charged particle beam 3 and a magnetic hexapole field to reduce an astigmatism caused by the deflections of the deflecting system 1. In order to reduce the astigmatism, the hexapole field is adjusted through a correcting current $I_c$ flowing through the two correcting coils 1a, 1b. With an adjustment of the correcting current $I_c$, it is possible to correct the astigmatism generated by one or several deflectors.

If there is only one deflecting pair of correcting coils 7 within the deflecting system 1, it is preferred that correcting current $I_c$ is adjusted to reduce the astigmatism that is accumulated by all deflectors of the deflecting system 1. If there is one deflecting pair of correcting coils 7, 8 for each deflector D1, D2 of the deflecting system 1, it is preferred that the astigmatism of each deflector is corrected individually by an adjustment of the correcting current $I_c$ of the corresponding deflecting pair of correcting coils 7, 8. In either way, it is possible to reduce the astigmatism of the deflecting system 1 at least by more than 50%. However, depending on the precision of the alignment of the deflectors D1, D2, D3, D4 and on the deflecting pair of correcting coils 7, 8, a reduction of the astigmatism by more than 80% and even more than 95% can be achieved compared to the situation when the deflecting pairs of correcting coils 7, 8 are switched off.

While the present invention includes electric or magnetic deflectors, it is preferred for the deflecting system 1 of FIG. 6a to 6e that the deflectors D1, D2, D3 and D4 are magnetic deflectors. In this case, the deflecting system 1 can be used to separate a primary charged particle beam 3 from the beam of secondary charged particles 4 which enters the deflecting system 1 from the opposite direction (see FIG. 5). Due to the Lorenz force, the beam of secondary charged particles 4 coming from below becomes deflected into the opposite direction. This way the beam secondary charged particles 4 can be detected and analyzed by a detector 23 without the detector being in the way of the primary charged particle beam 3.

Preferably, the deflectors D1, D2, D3 and D4 and/or the deflecting pairs of correcting coils 7, 8 of FIG. 6a to 6e are positioned and oriented to ensure that they deflect the charged particle beam 3 within essentially the same first deflection plane S. "Essentially the same plane" refers to a coplanarity of the deflection planes of each deflector within 10 degrees and preferably within 2 degrees.

Further, in FIG. 6a to 6e, it is advantageous to have any of the deflecting pairs of correcting coils 7, 8 positioned close to one of the deflectors D1, D2, D3, D4 to form first, second, third and/or fourth correcting deflectors CD1, CD2, CD3 or CD4. Preferably, the deflecting pairs of correcting coils 7, 8 are nested within a pair of deflecting coils or, vice versa, the pairs of deflecting coils are nested within a respective deflecting pair of correcting coils 7, 8, as e.g. shown in the FIGS. 4 and 5a to 5D.

Figure 6A:
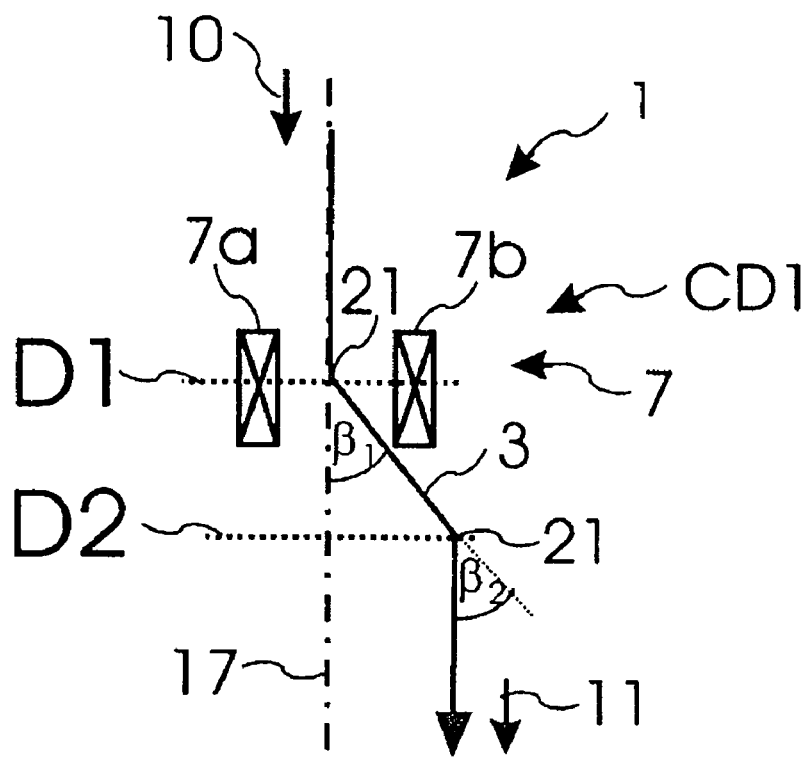
FIG. 6a illustrates a schematic view of a first deflecting system according to the invention having two deflectors including a first corrected deflector and equal first and second directions.

In FIG. 6a, the deflecting system 1 comprises a first deflector D1 to deflect a charged particle beam 3 off the first direction 10 by a first deflection angle $\beta_1$, and a second deflector D2 to deflect the deflected charged particle beam 3 by second deflection angle $\beta_2$ into the second direction 11. In the case of FIG. 6, the first deflection angle $\beta_1$ and the second deflection angle $\beta_2$ are essentially equal to ensure that the second direction 11 is essentially equal to the first direction 10. In this way the charged particle beam 3 can impinge on a specimen at the same landing angle as without the first and the second deflectors. "Essentially equal direction" refers to the same direction within 4 degrees and preferably within 2 degrees. While it is advantageous to use as few deflectors as possible to keep the complexity of a beam optical system low, with only two deflectors D1, D2, it is not possible to direct the charged particle beam 3 back onto the optical axis 17.

Deflecting a charged particle beam each time by the same deflection angles $\beta$ simplifies a design of a deflecting system 1 considerably. With the same deflection angles, the deflectors can be equally shaped and have the same number of windings. Lu addition, the current for the coils can be provided by the same current source. For example, in FIG. 6a. the first deflector D1 and the second deflector D2 are identical with the only difference that the current provided for the coils of the first deflector D1 is fed through the coils of the second deflector D2 in an opposite direction. This way, the first deflection angle $\beta_1$ is the same as the second deflection angle $\beta_2$ but in the opposite direction.

In a preferred embodiment of the invention, the first deflector D1 and the deflecting pair of correcting coils 7 are positioned with respect to each other to form a first corrected deflector CD1 as described above. This way, the deflection and the correction of the astigmatism can be independently adjusted with respect to each other. Preferably, the first corrected deflector CD1 is one of the corrected deflectors CD as described above.

Figure 6B:
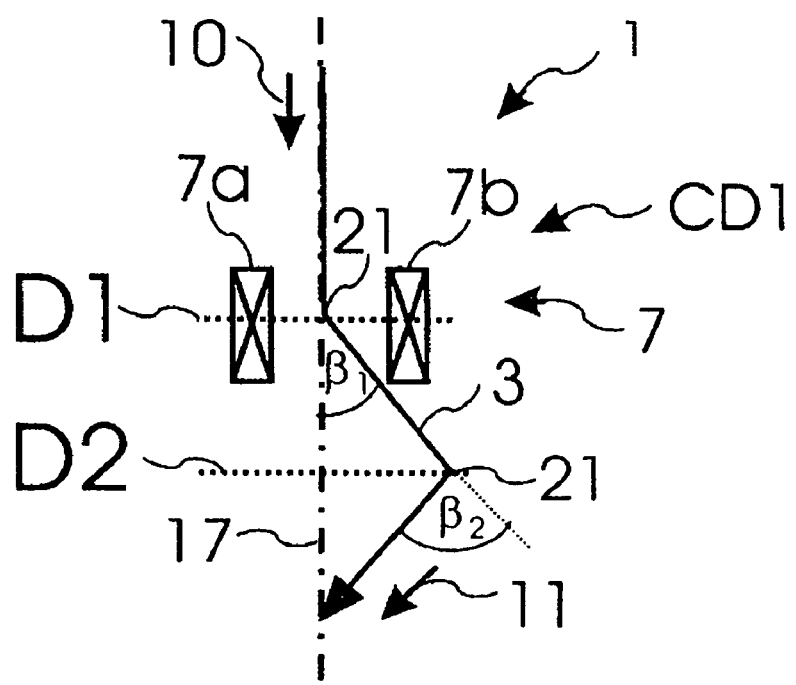
FIG. 6b illustrates a schematic view of a second deflecting system according to the invention having two deflectors including a first corrected deflector and different first and second directions.

The deflecting system 1 of FIG. 6b is identical to the deflecting system 1 of FIG. 6a with the difference that the second deflector D2 is capable of deflecting the charged particle beam 3 by a deflection angle $\beta_2$ which can be varied independently from the first deflection angle $\beta_1$. This way, it is possible to direct the charged particle beam 3 onto a position where the optical axis 17 intersects with a specimen that is to be probed or structured. This allows the charged particle beam 3 to be directed to the position on the specimen where the charged particle beam 3 would impinge on the specimen with the deflecting system 1 switched off. Again, like in FIG. 6b, the deflecting pair of correcting coils 7 and the first deflector D1 are preferably positioned to form a first corrected deflector CD1.

Figure 6C:
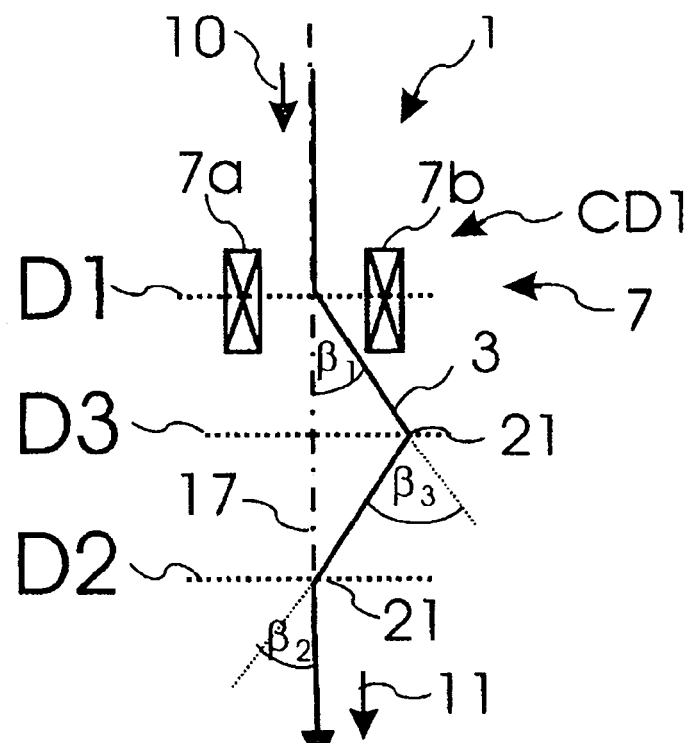
FIG. 6c illustrates a schematic view of a third deflecting system according to the invention having three deflectors including a first corrected deflector and equal first and second directions.

FIG. 6c discloses a deflecting system 1 like in FIG. 6a with the difference that it comprises a third deflector D3 between the first D1 and the second deflector D2. The first deflector D1 deflects the charged particle beam 3 by a first deflection angle $\beta_1$, away from the optical axis 17, the third deflector D3 deflects the charged particle beam 3 by a third deflection angle $\beta_3$ back towards the optical axis 17 and the second deflector D2 deflects the charged particle beam 3 by a second deflection angle $\beta_2$ into the second direction 11 which is essentially equal to the first direction 10. The deflecting system 1 of FIG. 6c can be used in a charged particle beam device where it is important that the charged particle beam 3 arrives at the specimen 19 at the same position and at the same landing angle as it does when the deflecting system 1 is switched off.

Figure 6D:
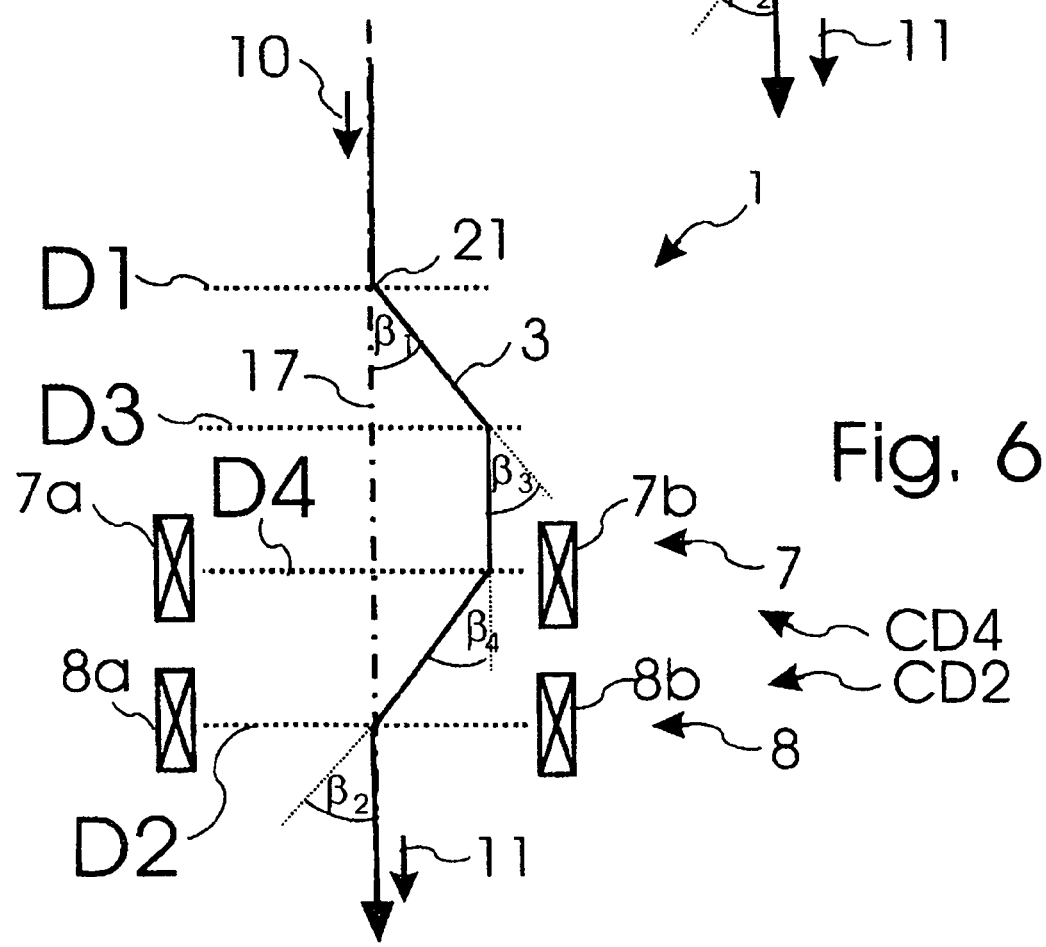
FIG. 6d illustrates a schematic view of a fourth deflecting system according to the invention having four deflectors for providing the same deflection angles including a second and a third corrected deflector.
Figure 6E:
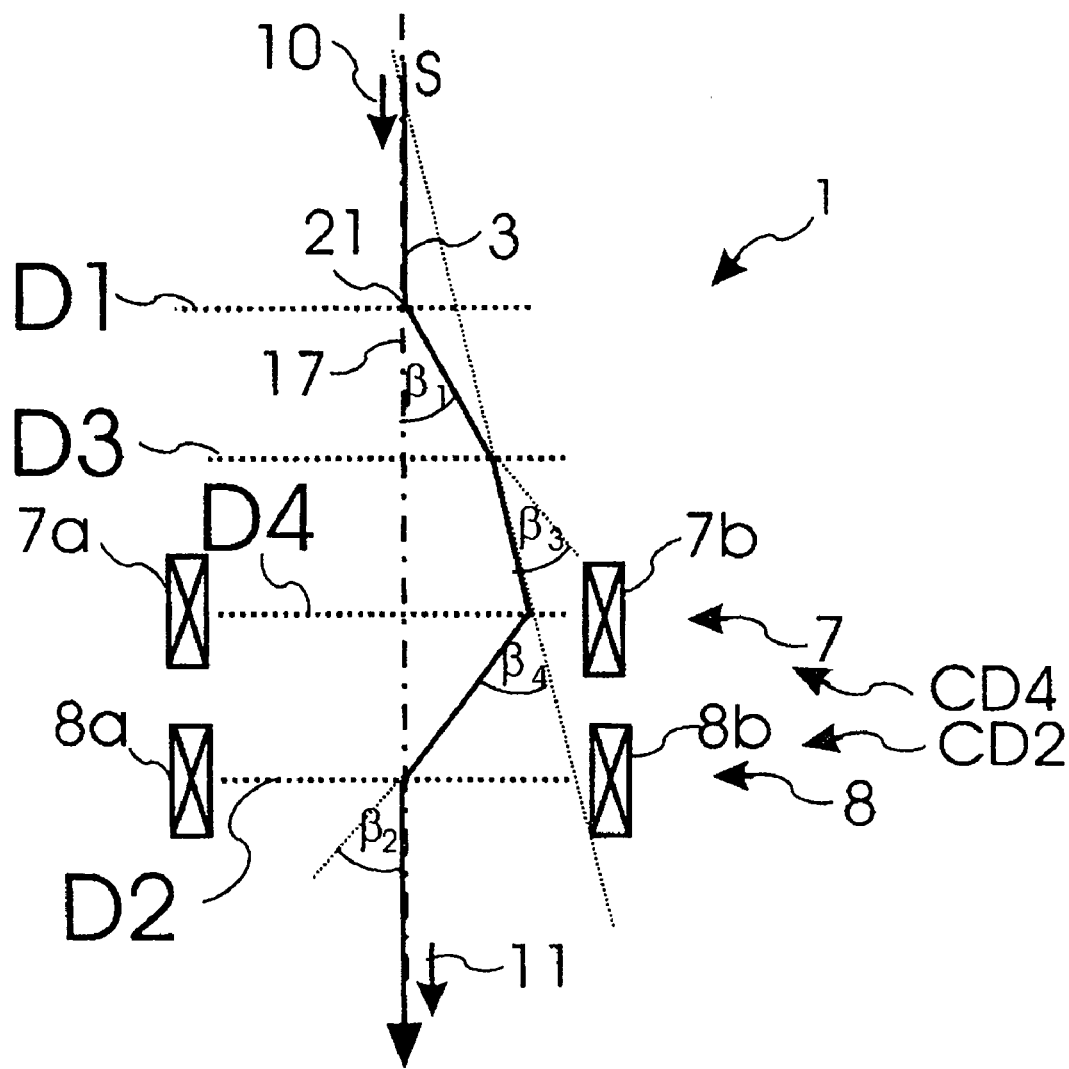
FIG. 6e illustrates a schematic view of a fifth deflecting system according to the invention having four deflectors for providing different deflection angles and including a second and a third corrected deflector.

In FIG. 6e, the design of the three deflectors is such that the first deflection angle $\beta_1$ and the second deflection angle $\beta_2$ are essentially equal. This way, like in FIG. 6a, the first deflector D1 and the second deflector D2 can be the same type of a deflector. In addition, the first deflector D1 and the second deflector D2 can be operated with the same current source. The third deflector D3, in contrast, is required to deflect the charged particle beam 3 by twice the angle of the first or second deflection angle $\beta_1$.

The deflecting pair of correcting coils 7 of the deflecting system 1 of FIG. 6c is placed at the first deflector D1, like in FIGS. 6a and 6b. Again, it is preferred that the first deflector D1 and the deflecting pair of correcting coils 7 form a first corrected deflector CD1. However, this is only an example, since the deflecting pair of correcting coils 7 could as well be placed at the second deflector D2 to form a second corrected deflector CD2 with the second deflector D2 and/or at the third deflector D3 to form a third corrected deflector CD3 as described above e.g. in FIG. 4 and FIG. 5a to 5d.

FIG. 6d discloses a fourth example of a deflecting system 1 according to the invention which comprises a fourth deflector D4 in addition to the first D1, the second deflector D2 and the third deflector D3. In FIG. 6d, the first deflector D1 deflects the charged particle beam 3 by a first deflection angle $\beta_1$ away from the optical axis 17, the third deflector D3 deflects the charged particle beam 3 by the third deflection angle $\beta_3$ back into the direction of the optical axis 17, the fourth deflection angle $\beta_4$ deflects the charged particle beam 3 towards the optical axis 17 and the second deflector D2 deflects the charged particle beam 3 into the second direction 11. Again, like in FIG. 6c, the first direction 10 is essentially equal to the second direction 11. In addition, in FIG. 6d, the deflecting system 1 can be made in a way where the four deflection angles $\beta_1$, $\beta_2$, $\beta_3$, $\beta_4$ are essentially equal. This way, the four deflectors can be the same, and they can be operated with current from the same current source.

The deflecting system 1 of FIG. 6d comprises two deflecting pair of correcting coils 7, 8. Preferably, the first deflecting pair of correcting coils 7, 7a, 7b is positioned with respect to the fourth deflector D4 to form a fourth corrected deflector CD4 and, preferably, the further deflecting pairs of correcting coils 8; 8a; 8b is positioned with respect to the second deflector D2 to form a second corrected deflector CD2, as described above.

In FIG. 6e, the deflecting system 1 is the same as the deflecting system 1 of FIG. 6d, with the difference that the first and the third deflection angles $\beta_1$, $\beta_3$ are adjusted to ensure that a straight line along the direction of the charged particle beam 3 after the second deflection intersects with the charged particle beam trajectory at some intersection point S. Preferably, the intersection point S coincides with the position of the focal plane of a lens or a crossover of the charged particle beam. With such an alignment, it is easier to adjust the beam optical components for an optimum focus.

Figure 7:
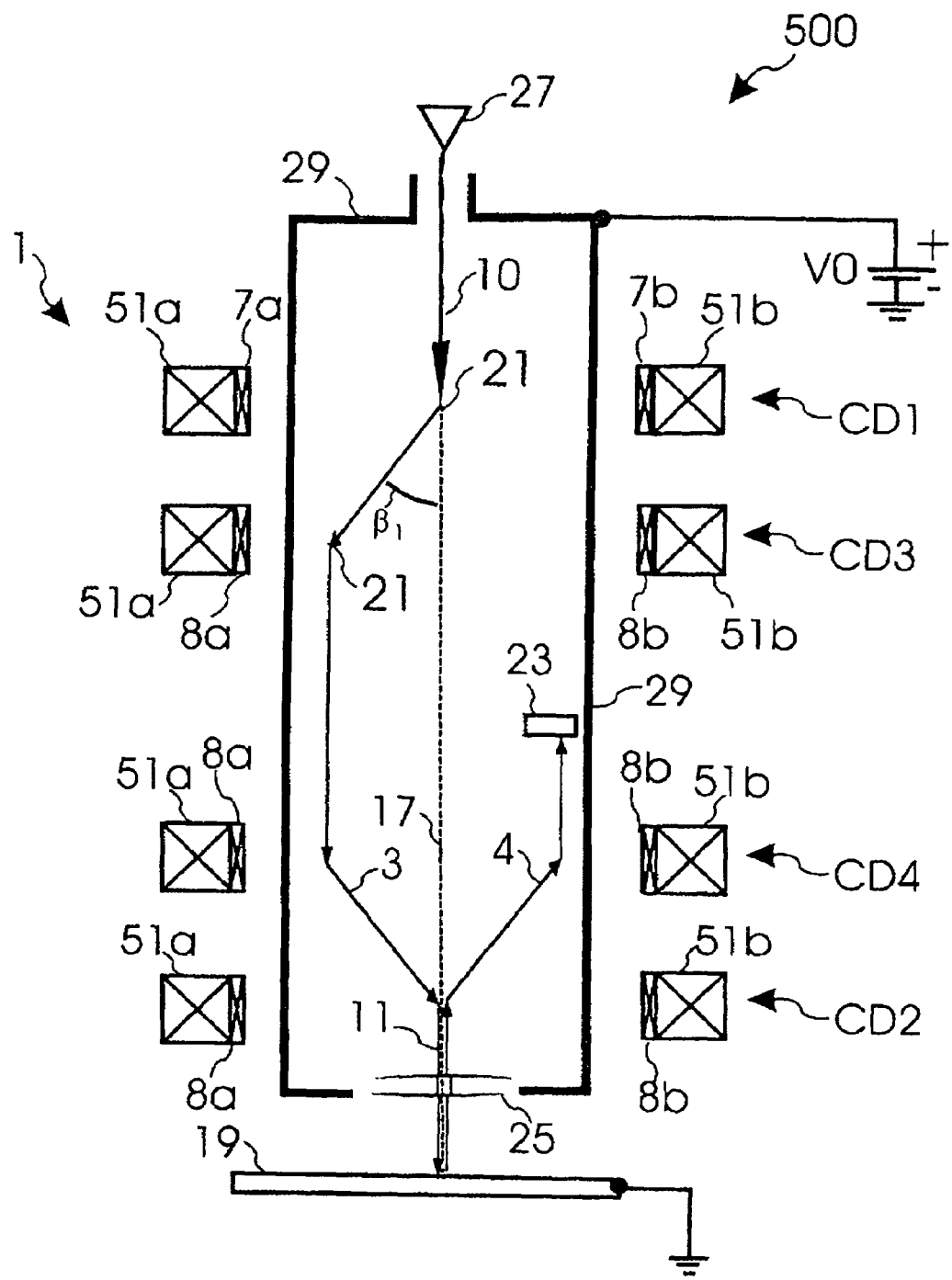
FIG. 7 illustrates a schematic view of a charged particle beam device according to the invention having a charged particle beam source, a deflecting system with four corrected deflectors and a detector.

FIG. 7 represents a schematic cross section through a charged particle beam device 500 which uses a deflecting system 1 with four corrected deflectors CD1, CD2, CD3 and CD4 to separate the primary charged particle beam 3 from the beam of secondary charged particles 4. While the description below is focused on a design of a scanning electron microscope (SEM), it also applies to other charged particle beam devices which use ions or electrons to probe or structure a specimen.

The SEM of FIG. 7 includes an electron beam source 27 to generate an electron beam 3, a high voltage beam tube 29 at a tube voltage $V_O$ to accelerate and shield the electrons of the charged particle beam 3, a deflecting system 1 having a first corrected deflector CD1, a second corrected deflector CD2, a third corrected deflector CD3, a fourth corrected deflector CD4, and an objective lens 25. The primary charged particle beam 3 within the high voltage beam tube 29 becomes deflected four times by the four corrected deflectors CD1, CD2, CD3 and CD4 before it passes through the objective lens 25 to be focused onto a specimen 19. On its way from the objective lens 25 to the specimen 19, the primary charged particle beam 3 is slowed down due to the more negative voltage of the specimen 19 which is connected to ground. The secondary charged particles 4 are generated through interactions of the primary charged particles 3 with the specimen 19. Because of the positive tube voltage $V_O$, the secondary charged particles 4 become accelerated towards the objective lens 25 to become separated from the trajectory of the primary charged particle beam 3 only when they reach the second corrected deflector CD2. There, the second corrected deflector CD2 and the fourth corrected deflector CD4 deflect the secondary charged particles 4 twice before they reach the particle detector 23. With the detector 23, the secondary charged particles t are detected and analyzed.

The high voltage beam 29 tube of the SEM is also known as "liner tube" since it provides a protective electric potential for the primary charged article beam on its way to the specimen. The high voltage beam tube is a well (flown means to improve the focusing quality of an SEM. More details about he high voltage beam tube 29 are described e.g. in "*High precision electron optical system for absolute and CD-measurements on large substrates*" by J. Rosien, S. Lanio and H. P. Feuerbaum in "Nuclear Instruments and Methods in Physics Research", A 363 (1995) pp. 25–30. The high voltage beam tube 29 is usually a tube-like electrode enclosing the primary charged particle beam 3 and extending from the region close to the electron beam source 27 to the objective lens 25. With its high positive tube voltage $V_O$, it helps to accelerate the electron beam 3 to a high energy early on to minimize beam spread due to coulomb interactions between the electrons. It further can be used to provide fl electric field for the combined electromagnetic focusing lens 25, which provides superior focusing. More details of the combined electromagnetic focusing lens are given in the article mentioned above.

The high voltage beam tube 29 also facilitates the separation of the primary charged particle beam 3 due to the positive high tube voltage $V_O$ which accelerates the secondary charged particles 4 towards the objective lens 25 to enter the inside of the high voltage beam tube 29. This way, even though the primary charged particle beam 3 and the secondary charged particles 4 see the same deflecting fields of the second corrected deflector CD2 and the fourth corrected deflector CD4, both beams become separated since they enter the deflecting system 1 from opposite directions. Therefore, no additional deflectors are needed to detect the secondary charged particles 4.

There are many other ways in which a charged particle beam device with a deflecting system 1 like in FIG. 7 can he realized. The charged particle beam device of FIG. 7 only serves as one embodiment of many possible others, and is not meant to limit the invention. During operation of the SEM of FIG. 7, the specimen 19 is usually at ground potential, while the tube voltage $V_O$ is in the range of 8,000V to 12,000 V, preferably at 10,000 V, to accelerate the primary charged particle beam 3 to an energy between 8 to 12 keV The first, second, third and fourth corrected deflector CD1, CD2, CD3 and CD4 each comprise a pair of saddle-like deflecting coils 51, 51a, 51b and a deflecting pair of correcting coils 7, 7a, 7b, 8, 8a, 8b. Preferably, the deflecting pair of correcting coils 7, 7a, 7b, 8, 8a, 8b are each a pair of saddle-like correcting coils 75, 75a, 75b. Preferably, for each of the corrected deflectors CD1, CD2, CD3 and CD4 the deflecting pair of correcting coils and the according pair of deflecting coils are fully nested within each other. In a preferred embodiment of the invention, each of the corrected deflectors CD1, CD2, CD3 and CD4 are corrected deflectors CD as shown in FIG. 4.

In FIG. 7, the four corrected deflectors CD1, CD2, CD3 or CD4 surround the high voltage beam tube 29. This way, the electric potentials of he corrected deflectors can be kept at a low potential, e.g. ground potential, without interfering with the charged particle beam 3. Further, in FIG. 7, the deflecting fields of the first corrected deflector CD1, the second corrected deflector CD2, the third corrected deflector CD3 and the fourth corrected deflector CD4 are adjusted in a way that the first deflection angle $\beta_1$ of the first corrected deflector CD1, the second deflection angle $\beta_2$ of the second corrected deflector CD2, the third deflection angle $\beta_3$ of the third corrected deflector CD3 and the fourth deflection angle $\beta_4$ of the fourth corrected deflector CD4 are essentially equal. Typically with the primary charged particle beam 3 at an energy of about 10 keV, the four deflection angles are in the range between 4 to 10 degrees. The distance between the first corrected deflector CD1 and the third corrected deflector CD3 is about 40 mm, as measured from one point of deflection 21 to the other point of deflection. This translates to a lateral deflection distance of the charged particle of about 4 mm between the first corrected deflector CD1 and the third corrected deflector CD1. The apertures of the four corrected deflectors CD1, CD2 CD3 and CD4 are large enough to ensure that they can be coaxially aligned to the same optical axis 17 despite the deflections of the primary charged particle beam 3 and the secondary charged particles 4. Typically, the aperture of the corrected deflectors is in the range of 30 to 40 mm.

In prior art charged particle beam devices deflecting systems with four deflectors have been hampered by the fact that the four deflections accumulate a large astigmatism to the primary charged particle beam 3. The deflecting system 1 of the charged particle beam device of FIG. 7, however, suppresses the astigmatism by using the corrected deflectors CD1, CD2, CD3 and CD4.

In FIG. 7 the deflecting system 1 deflects the charged particle beam essentially within one deflection plane 5. Deflecting systems which can deflect a charged particle beam within one deflection plane only are referred to as one-dimensional deflecting system. However, for many applications, it is advantageous to have a charged particle beam device which includes a two-dimensional deflecting system instead. This way the primary charged particle 3 and the secondary charged particles 4 can be deflected within any deflection plane along the optical axis 17. By switching the deflection plane it is possible to direct the primary charged particle beam through different beam optical components, or to deflect the secondary charged particles 4 into different directions to different detectors without having to mechanically move any of the beam optical components or detectors.

Figure 8A:
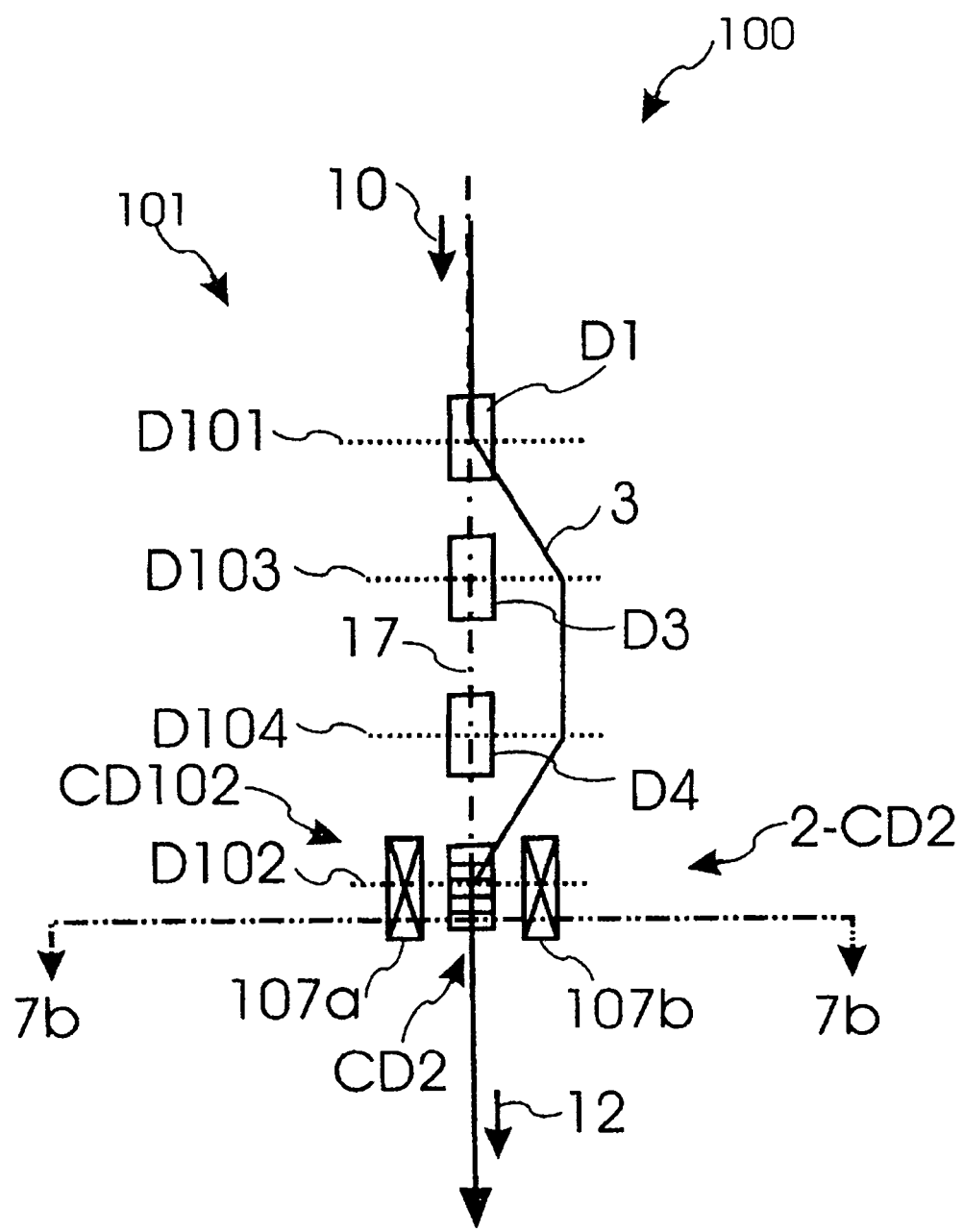
FIG. 8a illustrates a schematic view of a two-dimensional deflecting system according to the invention with four deflectors for each deflection plane including a two-dimensional corrected deflector.

FIG. 8a schematically discloses a cross section through a preferred embodiment of a two-dimensional deflecting system 100 according to the invention. The two-dimensional deflecting system 100 of FIG. 8a comprises a first deflecting system 1 with a first deflector D1, a third deflector D3, a fourth deflector D4 and a second corrected deflector CD2. The second corrected deflector CD2 is comprised of a deflecting pair of correcting coils 7 with the two correcting coils 107a, 107b (not shown in FIG. 8a), and a second orthogonal deflector D2 (not shown in FIG. 8a), like e.g. in FIG. 4. The three deflectors D1, D3, D4 and the second corrected deflector CD2 are oriented to deflect the charged particle beam 3 essentially within the first deflection plane 5, which in FIG. 8a is orthogonal to the plane of the paper.

The two-dimensional deflecting system 100 also includes a second deflection system 101 to deflect the charged particle beam 3 within a second deflection plane 15, which in FIG. 8a is essentially orthogonal to the first deflection plane 5. The second deflecting system 101 comprises a first orthogonal deflector D101, a third orthogonal deflector D103, a fourth orthogonal deflector D104 and a second orthogonal corrected deflector CD102. Like the second corrected deflector CD2 of the first deflecting system 1, the second orthogonal corrected deflector CD102 is comprised of a deflecting orthogonal pair of correcting coils 107 with the two orthogonal correcting coils 107a, 107b, and the second orthogonal deflector D102. The positions and types of deflectors and correcting coils of the second deflection system 101 are essentially the same as the first deflection system 1, except that the second deflecting system 101 is rotated by 90 degrees around the optical axis 17 with respect to the first deflecting system 1 to ensure that the first deflection plane 5 is orthogonal to the second deflection plane 15.

FIG. 8a illustrates a preferred embodiment where the first deflector D1 of the first deflecting system 1 and the first orthogonal deflector D101 of the second deflecting system 101, are both pairs of saddle-like deflecting coils 51 which are nested within each other. Similarly, it is preferred that the third deflector D3 and the third orthogonal deflector D103 are both pairs of saddle-like deflecting coils 51 which are nested within each other. Similarly, it is preferred that the fourth deflector D4 and the fourth orthogonal deflector D104 are both pairs of saddle-like deflecting coils 51 which are nested within each other.

In FIG. 8a, it is further disclosed that the second corrected deflector CD2 and the second orthogonal corrected deflector CD102 are nested to form a second two-dimensional corrected deflector 2-CD2. The second two-dimensional corrected deflector 2-CD2 is capable of correcting the astigmatism independently of the deflection plane within which the primary charged particle beam 3 is deflected.

Figure 8B:
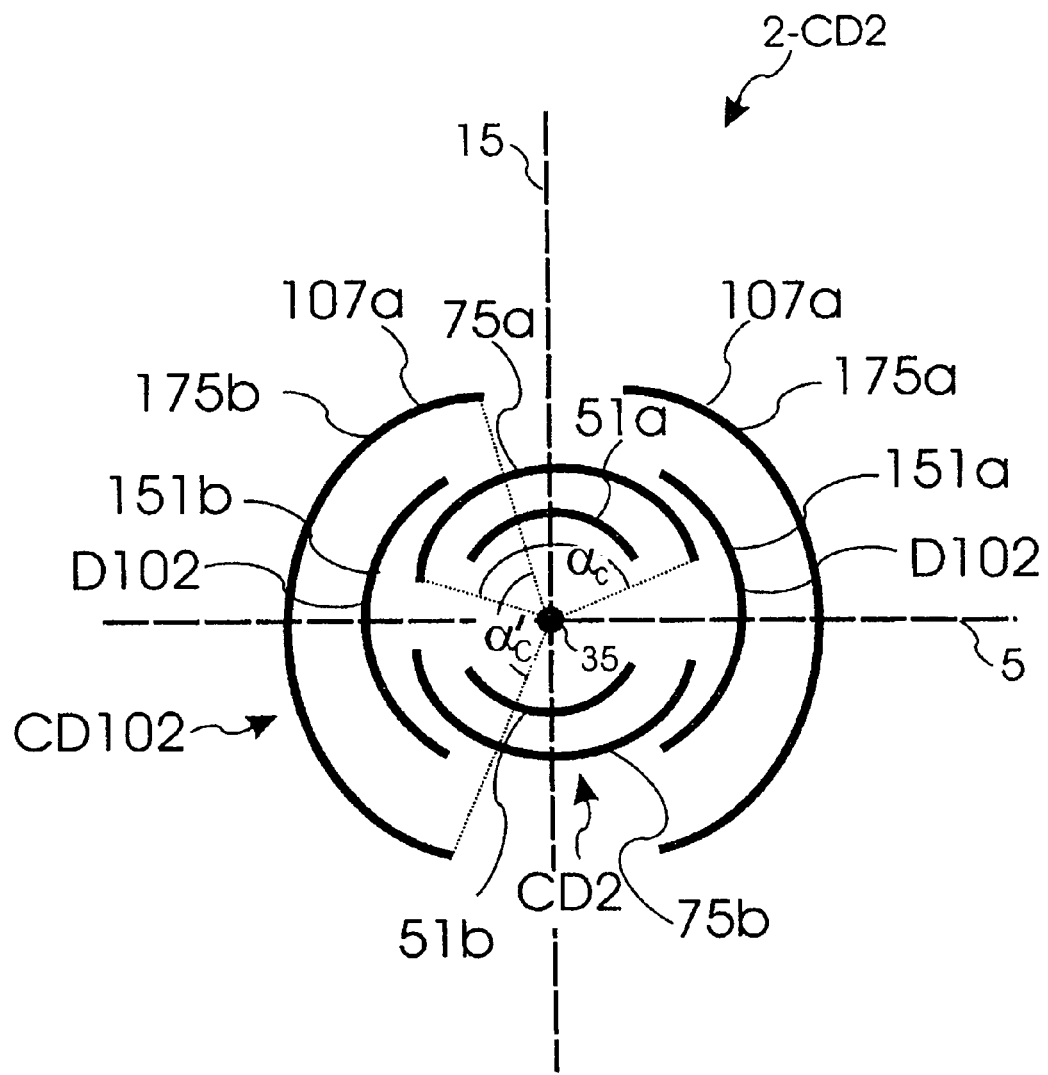
FIG. 8b illustrates a schematic cross section through the two-dimensional corrected deflector of FIG. 8a to generate a negative magnetic hexapole field.

FIG. 8b discloses a cross sectional view through a preferred embodiment of the second two-dimensional corrected deflector 2-CI)2. The second two-dimensional corrected deflector 2-CD2 is comprised of a second corrected deflector CD2 and a second orthogonal corrected deflector CD1O2. In the embodiment of FIG. 8b, the second corrected deflector CD2 and the second orthogonal corrected deflector CD102 are both of the type as shown in FIG. 5a, however the pairs of saddle-like coils 175a, 175b and 151a, 151b of the second orthogonal corrected deflector CD102 are rotated by 90 degrees around the axis 35 of the pair of coils with respect to the pairs of saddle-like coils 75a, 75b and 51a, 51b of the second corrected deflector CD2. This is to ensure that the second orthogonal corrected deflector CD102 is capable of deflecting and correcting the charged particle beam 3 within second deflection plane 15 which is essentially orthogonal to the first deflection plane 5.

Further, in the case of FIG. 8b, the diameters of the pairs of coils of the second orthogonal corrected deflector CD102 are larger than the diameters of the pairs of coils of the second corrected deflector CD2 to be able to nest the second corrected deflector CD2 within the second orthogonal corrected deflector CD102. With the nesting, it is possible to have the points of deflection 21 of all pairs of coils at the same position to have a stable trajectory independent of the corrections of the astigmatism. Further, the nesting facilitates a compact design of the optical beam column to keep the traveling distance of the charged particle beam 3 short.

FIG. 8b also discloses that the opening angles $\alpha_c$ of the pair of saddle-like correcting coils 75a, 75b and the opening angle $\alpha_c$ of the pair of orthogonal saddle-like correcting coils

175a, 175b. as described in FIG. 5a, are preferably larger than 160 degrees, and generally as close as possible to 180 degrees to maximize the magnetic hexapole field component. The opening angles $\alpha_c$ (not shown) of the pair of saddle-like deflecting coils 51a, 51b, 151a, 151b of both the second corrected deflector CD2 and the second orthogonal corrected deflector CD102 are, in contrast, preferably close or equal to 120 degrees to minimize the magnetic hexapole field component.

The second two-dimensional corrected deflector 2-CD2 of FIG. 8b is only an example of many different ways to design a two-dimensional corrected deflector according to the invention. For example, any or all of the pairs of saddle-like coils can as well be replaced by a pair of toroidal coils. Further, there are many different ways to nest the pair of coils within each other which all are within the scope of the present invention. Also, it is not necessary that the pair of saddle-like coils of the second orthogonal corrected deflector CD 102 are orthogonal to the pair of saddle-like coils of the second corrected deflector CD2, since it is also possible to deflect a charged particle beam within any deflection plane when the first deflection plane 5 is not orthogonal 10 the second deflection plane 15. However, the more the first deflection plane 5 is orthogonal to the second deflection plane 15, the more effective the corrections. Therefore, it is preferred that the first deflection plane 5 and the second deflection plane 15 are orthogonal within less than 10 degrees and preferably within less than 2 degrees.

Further, the invention is not limited to the case where the two-dimensional corrected deflector is the last of the deflectors of the deflecting system 100. Rather, it is within the scope of the invention to have a two-dimensional corrected deflector at the positions of the first, third or fourth deflectors of FIG. 8a. Also, in another preferred embodiment, the deflecting system 101 may have a first two-dimensional corrected deflector 2-CD1, a third two-dimensional corrected deflector 2-CD3 and/or a fourth two-dimensional corrected deflector 2-CD4 that replace the respective deflectors D1, D101, D3, D103, D4 and/or D104, respectively.

Figure 9A:
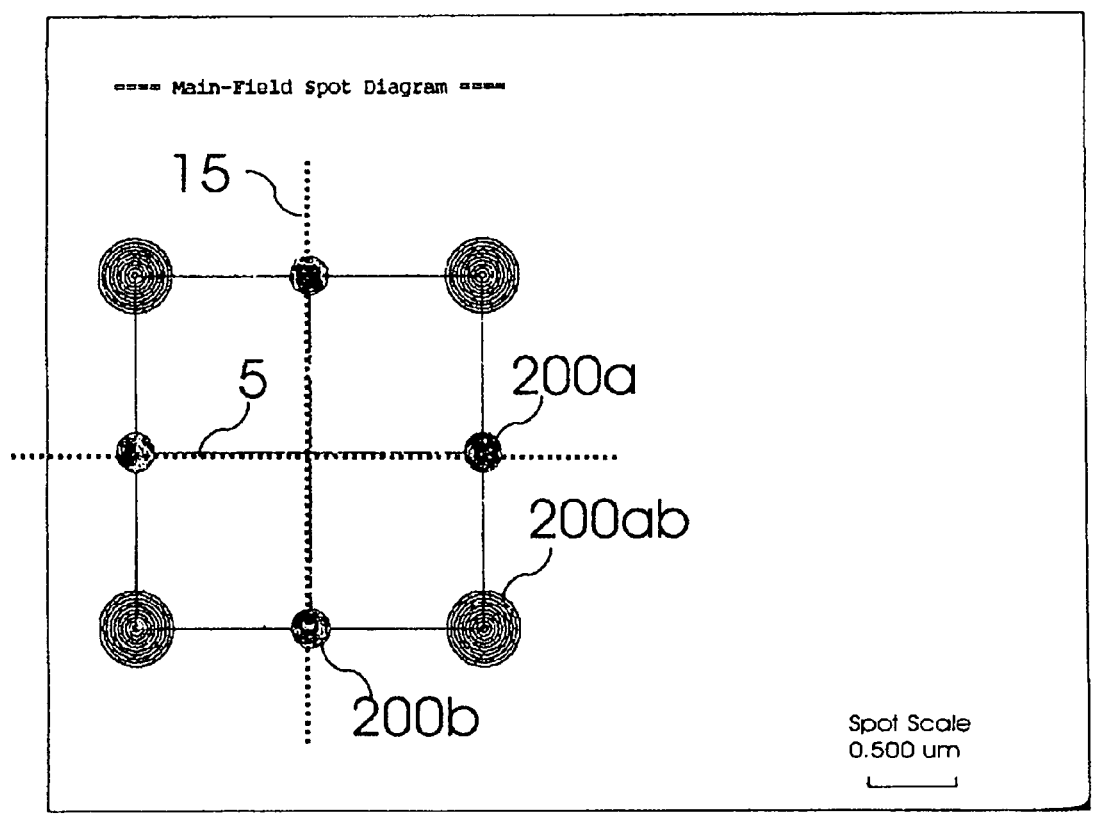
FIG. 9a is a beam spot diagram of a charged particle beam deflected by the two-dimensional deflecting system of FIG. 5a without using the deflecting pairs of correcting coils.
Figure 9B:
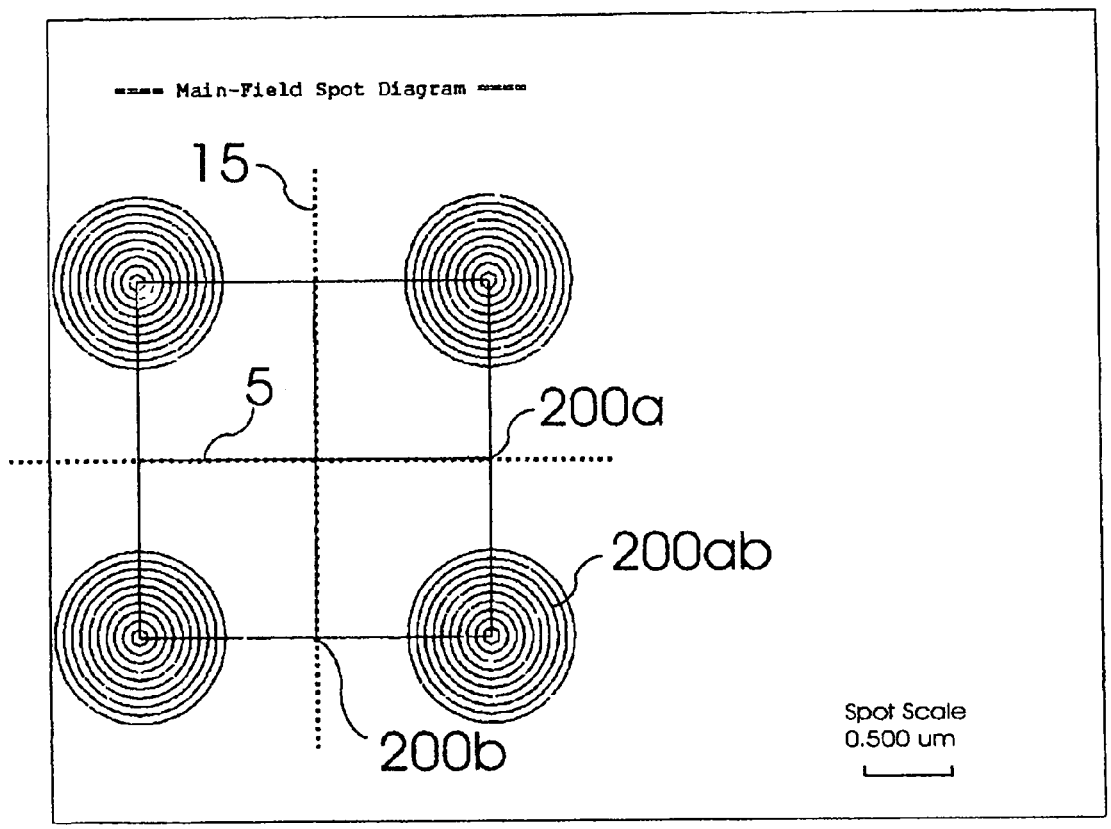
FIG. 9b is a beam spot diagram of a charged particle beam deflected by the two-dimensional deflecting system of FIG. 8a with the deflecting pairs of correcting coils correcting an astigmatism.

A comparison of the spot diagrams of FIGS. 9a and 9b discloses the effect of the deflecting pairs of correcting coils to the astigmatism of an electron beam 3 when the second two-dimensional corrected deflector 2-CD2 of FIG. 8b is used for the two-dimensional deflecting system 100 of FIG. 8a. In FIG. 9a and FIG. 9b, eight different beam spot sizes 200a, 200b and 200ab corresponding to the circles of least confusion of a charged particle beam 3 after four deflections are shown. Each of the eight beam spots 200a, 200b, 200ab corresponds to deflections within one of eight different deflection planes separated by a rotation of 45 degrees from one deflection plane to the next. The two beam spots 200a are obtained when the charged particle beam 3 is deflected four times within the first deflection plane 5 by providing the first deflecting system of FIG. 8a with a first set of deflection currents, and by "switching off" the currents of a second set of deflection currents 102 of the second deflecting system. Likewise, the two beam spots 200b are obtained when the charged particle beam 3 is deflected four times within the second deflection plane 15 by providing the second deflecting system 101 of FIG. 8a with a second set of deflection currents and by "switching off" the currents of the first set of deflection currents of the first deflecting system 1. Finally, the four beam spots 200ab are obtained when the charged particle beam 3 is deflected within the first deflection plane 5 and the second deflection plane 15 by providing the first deflection system 1 of FIG. 5a with the first set of deflection currents and the second set of deflection currents.

The first set of deflection currents mentioned above refers to the coil currents of the first deflector DI, the second deflector 02, the third deflector D3 and the fourth deflector D4 of FIG. 8a needed to deflect the electron beam 3 by the respective deflection angles $\beta_1$, $\beta_2$, $\beta_3$, and $\beta_4$ and within the first deflection plane 5. Likewise, the second set of deflection currents 102 mentioned above refers to the coil currents of the first orthogonal deflector D101, the second orthogonal deflector D102, the third orthogonal deflector D103 and the fourth Orthogonal deflector D 104 of FIG. 8a required to deflect the electron beam 3 by the respective deflection angles $\beta_1$, $\beta_2$, $\beta_3$, and $\beta_4$ within the second deflection plane I5. In the spot diagrams shown in FIGS. 9a and 9b, the lateral deflection of the two-dimensional deflecting system 100 within the first deflection plane 5 or the second deflection plane 15 is about 4 mm.

FIG. 9a shows the beam spots 200a, 200b, 200ab when no magnetic hexapole field is applied. This, in the case of a two-dimensional deflecting system 100 of FIG. 8a, is achieved by switching off the currents $I_c$ of the deflecting pair of correcting coils 7 and the deflecting orthogonal pair of correcting coils 107a, 107b. Since the opening angle of the saddle-like deflectors in FIG. 8a is 120 degrees, they do not contribute any magnetic hexapole component (see FIG. 2b).

As can be seen from FIG. 9a, the spot sizes 200a and 200b of the electron beam 3 are the same, independent of whether the electron beam 3 has been deflected within the first deflection plane 5 or within the second deflection plane 15. For both deflection planes, the spot sizes 200a, 200b of the electron beam 3 are about 220 nm. However, when both the first set of deflection currents and the second set of deflection currents are applied, the astigmatism contributions of the first deflection system and the orthogonal second deflection system add to an astigmatism which generates a beam spot size of about 550 nm, as shown by the diagonal spot sizes in FIG. 9a.

FIG. 9b, in contrast, shows the same beam spots 200a, 200b, 200ab of the two-dimensional deflecting system 100 of FIG. 8a with same deflections, with the difference that the currents of the deflecting pair of correcting coils 75a, 75h and the currents of the deflecting orthogonal pair of correcting coils 107a, 107b, 175a, 175b of the second two-dimensional corrected deflector 2-CD2 (see FIG. 8b) are optimized to reduce the astigmatism when the electron beam 3 is deflected within the first deflection plane 5 or the second deflection plane 15. A two-dimensional deflecting system with an astigmatism behavior as shown in FIG. 9b is highly advantageous, since e.g. it can be used for an SEM to deflect the electron beam within two different deflections with a significantly reduced astigmatism. A comparison between FIGS. 9a and 9b reveals that the astigmatism induced by deflections within the first deflection plane 5 or the second deflection plane 15 is reduced by more than 95%.

However, FIG. 9b also reveals that the astigmatism on the diagonals between the first deflection plane 5 and the second deflection plane 15 has increased to a beam spot size of 940 nm. This is because the hexapole components of the pair of saddle-like correcting coils 75a, 75b and the pair of orthogonal saddle-like correcting coils 175a, 175b are both negative due to their opening angles which are larger than 120 degrees Therefore the beam deforming forces of the magnetic hexapole fields of the pan of saddle-like correcting coils 75a, 75h and the pair of orthogonal saddle-like correcting coils 175a, 175h in the diagonal add up.

Figure 10A:
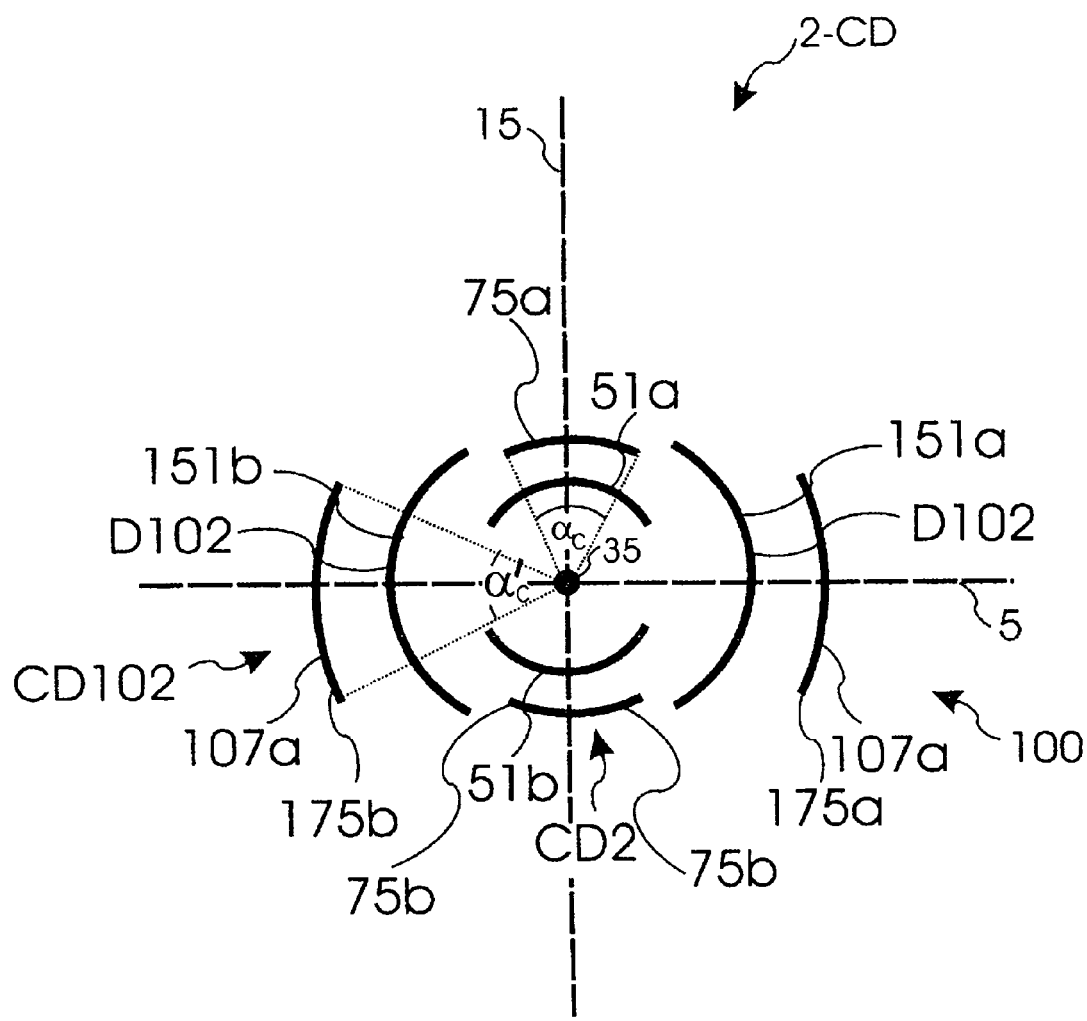
FIG. 10a illustrates a schematic cross section through a second two-dimensional corrected deflector to generate a positive magnetic hexapole field.

FIG. 10a discloses a second type of two-dimensional corrected deflector 2-CD2. It differs from the two-dimensional corrected deflector of FIG. 5b by the fact that the opening angle of the pair of saddle-like correcting coils 75a, 75h of the second corrected deflector CD2 and the opening angle of the deflecting orthogonal pair of saddle-like correcting coils are 60 degrees (instead of say 160 degrees) which provides a positive hexapole component.

Figure 10B:
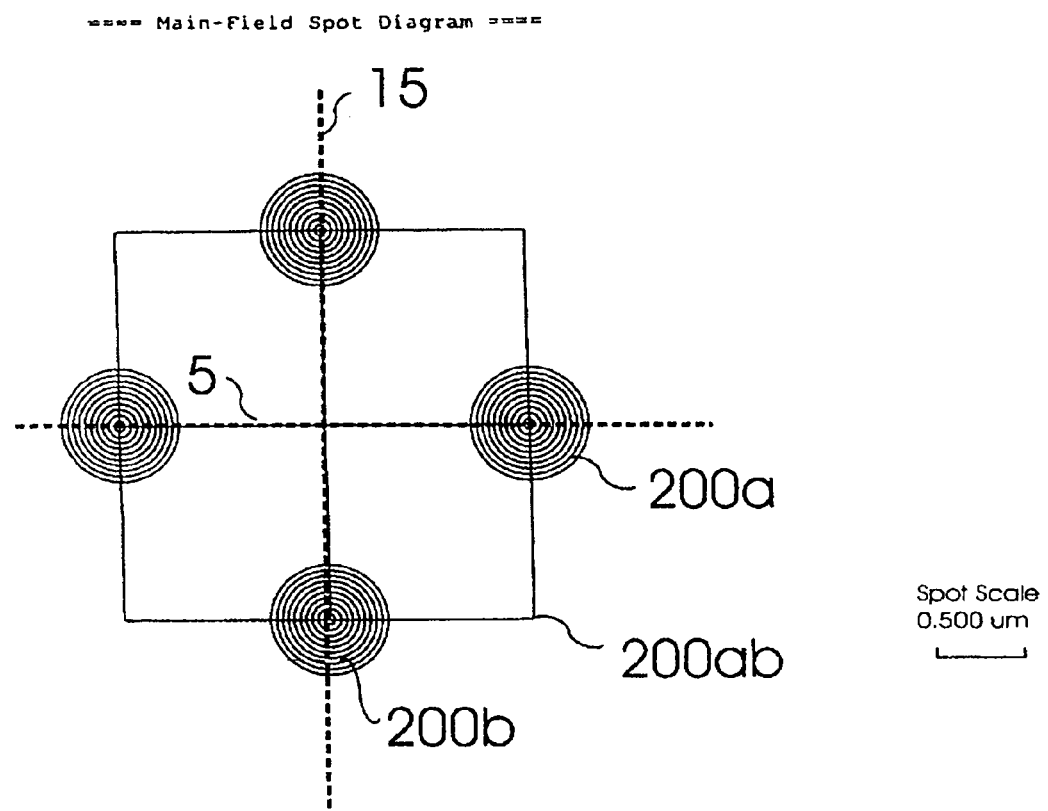

FIG. 10b illustrates the effect when the second two-dimensional corrected deflector 2-CD2 in the two-dimensional deflecting system 100 of FIG. 8a is replaced by the second two-dimensional corrected deflector 2-CD2 of FIG. 10a, In this case, the astigmatism due to deflections within the first deflection plane 5 or the second deflection plane 15 cannot be corrected, since the hexapole components of the pair of saddle-like correcting coils 175, 75 are both positive. However, as can be seen from FIG. 110b, the astigmatism is fully compensated for deflections in the diagonal, i.e. when the first set of deflection currents and the second set of deflection currents 102 are both switched on.

Figure 11A:
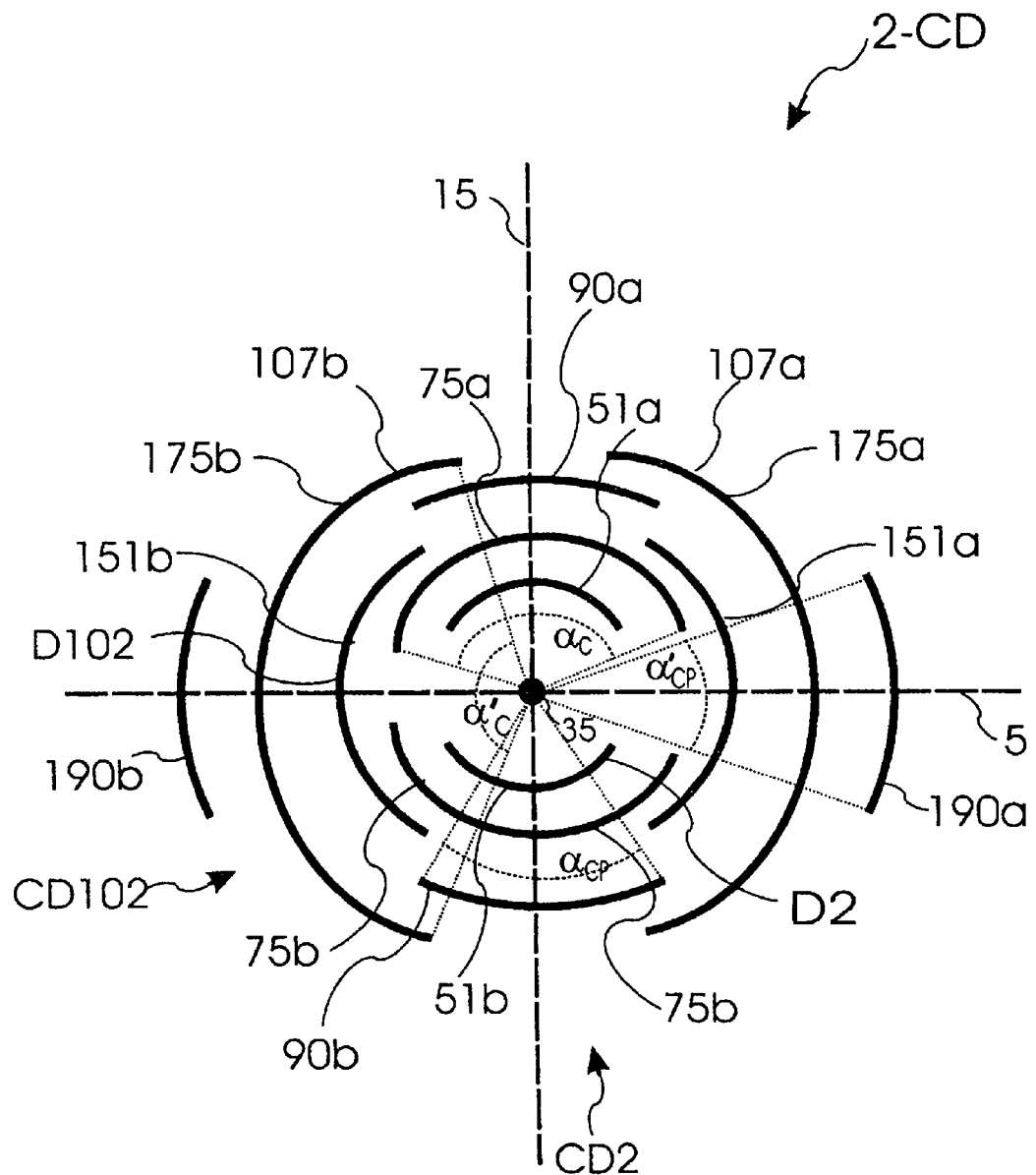
FIG. 11a illustrates schematic cross section through a third two-dimensional corrected/deflector like in FIG. 10a with an additional deflecting pair of correcting coils to generate a positive and a negative magnetic hexapole field.

FIG. 11a shows a two-dimensional corrected deflector 2-CD2 which combines the advantages of the two-dimensional corrected deflectors 2-CD2 of FIG. 8b and of FIG. 10a. The two-dimensional corrected deflector 2-CD2 of FIG. 11a is the same as the 2-CD2 of FIG. 5b, with the difference that second corrected deflector CD2 has a compensating pair of correcting coils 90a, 90b added, and the second orthogonal corrected deflector CDIO2 has an orthogonal compensating pair of correcting coils 190a, 190b. The compensating pair of correcting coils 90a, 90b and the orthogonal compensating pair of correcting coils 190a, 190b are both formed to provide a positive hexapole component. In the case of FIG. 11a, this is achieved by having the compensating pair of correcting coils 90a, 90b and the orthogonal compensating pair of correcting coils 190a, 190b as saddle-like coils with an opening angle of 60 degrees, like in FIG. 10a. This way, the two-dimensional corrected deflector is capable of providing a positive and a negative magnetic hexapole field component. This way, the two-dimensional corrected deflector is capable of suppressing the astigmatism for any deflection within any deflection plane.

For example, when the electron beam 3 is deflected within the first deflection plane 5 or the second deflection plane, the correcting currents of the pair of saddle-like correcting coils 75a,75h and the deflecting orthogonal pair of saddle-like correcting coils used to suppress the astigmatism, while the currents of the compensating pair of correcting coils 90a, 90b and the orthogonal compensating pair of correcting coils 190a, 190b are switched off.

However, when the electron beam 3 is deflected within the diagonal deflection plane the currents of the compensating pair of correcting coils if the orthogonal compensating pair of correcting coils are used to suppress the astigmatism, while the correcting currents of the pair of saddle-like correcting coils 75a 75b and the deflecting orthogonal pair of saddle-like correcting coils 175a, 175b are switched off.

For any other deflection between the diagonal and the first or second deflection plane 5, 15, both the compensating pairs of coils and the correcting pairs of coils have to be used for compensation. This way, with a proper adjustment of the correcting currents $^1$c for the compensating pairs of coils 90a, 90b, 190a, 190b and the correcting pairs of coils 75a, 75b, 175a, 175b, it is possible to suppress the astigmatism of the electron beam 3 independent of within what deflection plane it is deflected. The proper adjustment of the correcting currents can be carried out. e.g. by a look-up table which relates a given deflection of the electron beam to a set of correcting and deflecting currents whose values have been once calculated or experimentally established. A person skilled in the art knows how to calibrate and how to implement such a look-up table .e.g. in a database system.

Figure 11B:
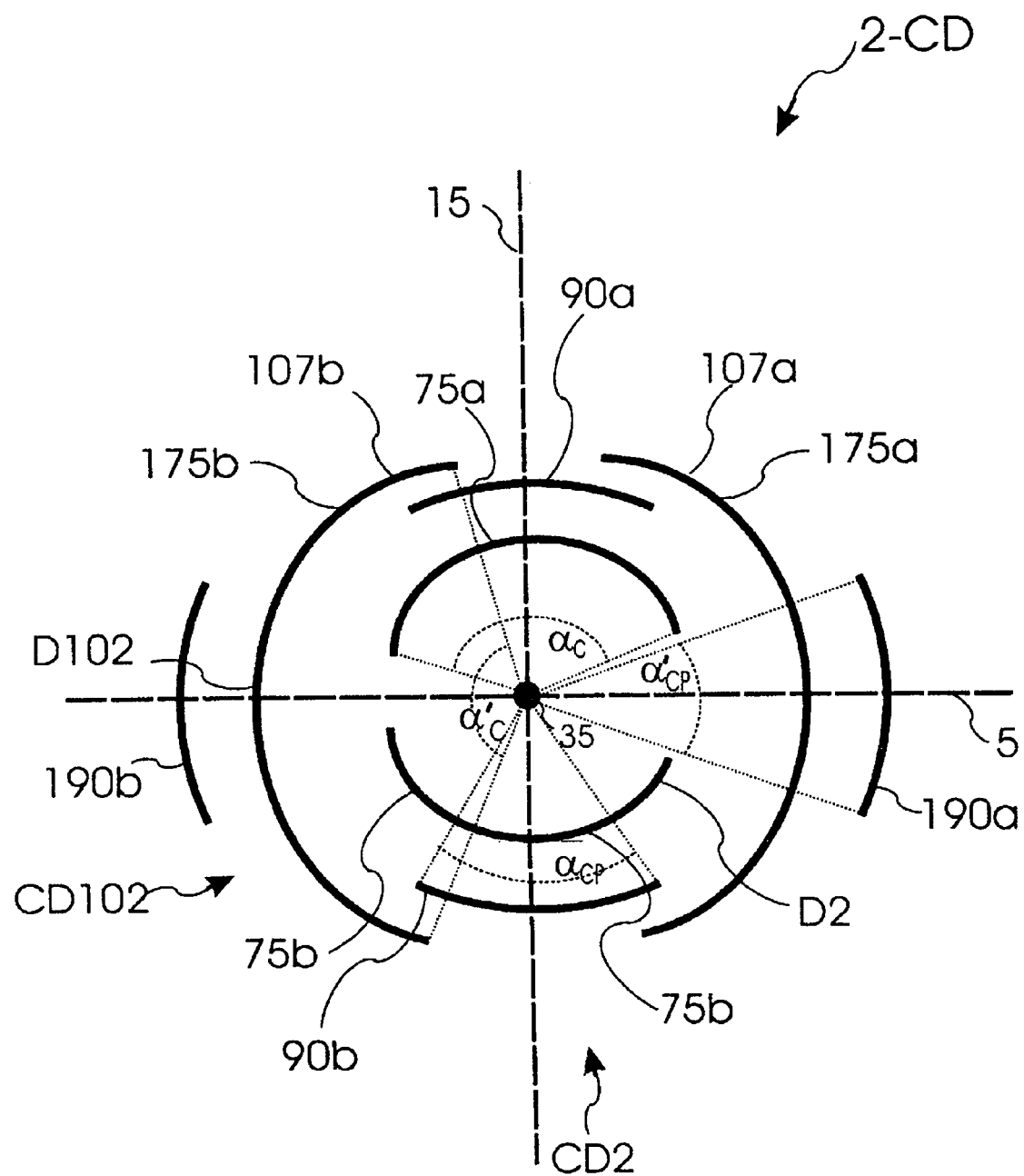
FIG. 11b illustrates schematic cross section through a fourth two-dimensional corrected deflector to generate a positive and a negative magnetic hexapole field.

FIG. 11b illustrates a second example of a two-dimensional corrected deflector 2-CD which is capable of compensating the astigmatism of a charged particle beam 3 independent of the deflection plane within which the charged particle beam 3 is deflected. The two-dimensional corrected deflector 2-CD of FIG. 11b is the same as the one shown in FIG. 11a, with the difference that the pair of saddle-like deflecting coils 51a, 51b and the pair of saddle-like correcting coils 75a, 75b of the second corrected deflector CD2 have been combined to form a combined pair of saddle-like deflecting coils, and with the difference that the pair of saddle-like deflecting coils and the pair of saddle-like correcting coils 175a, 175b of the second orthogonal corrected deflector CD102 have been combined to form an orthogonal combined pair of saddle-like deflecting coils. The combined pair of saddle-like deflecting coils and the orthogonal combined pair of saddle-like deflecting coils both have an opening angle larger than 120 degrees (preferably as close as possible to I80 degrees) to provide a negative hexapole field component. With an opening angle larger than 120 degrees, the combined pair of saddle-like deflecting coils and the orthogonal combined pair of saddle-like deflecting coils are capable of generating a dipole field and a negative hexapole field to both deflect the charged particle beam 3 and to correct the astigmatism.

A two-dimensional corrected deflector as described in FIG. 11b can be obtained by simply removing the pair of saddle-like deflecting coils 51a 51b from the two-dimensional corrected deflector of FIG. 11a. The removal of the pair of saddle-like deflecting coils 51a,b and of the orthogonal pair of saddle-like deflecting coils 151a, 151b is possible without losing the astigmatism compensating ability of the two-dimensional corrected deflector, since the compensating pairs of coils and the correcting pairs of coils inherently generate a magnetic dipole field which can be adjusted to perform the required deflection. The main advantage of the two-dimensional corrected deflector of FIG. 11b is that it requires less pairs of coils which considerably simplifies the manufacturing of a two-dimensional corrected deflector.

The two-dimensional corrected deflectors of FIGS. 11a and 11b are only exemplary embodiments in which a two-dimensional corrected deflector according to the invention can be realized. It is obvious for a person skilled in the art that there are many other designs of a two-dimensional corrected deflector possible. For example, each of the pairs of saddle-like coils can be replaced by a pair of toroidal coils, as indicated by the FIG. 5a to 5d. Further, there are many different orders possible in which a pair of coils is nested within the others which would all serve the spirit of the invention, i.e. to provide a magnetic hexapole field component for the reduction of an astigmatism caused by a deflection of a charged particle beam.

What is claimed is:

1. A deflecting system for deflecting a charged particle beam from a first direction to a second direction, the deflecting system comprising:
   a first deflector for deflecting said charged particle beam off the first direction within a first deflection plane;
   a second deflector for deflecting the deflected charged particle beam into the second direction within the first deflection plane; and at least one deflecting pair of correcting coils which is positioned and shaped to deflect the charged particle beam and to reduce an astigmatism of the charged particle beam caused by the deflections wherein the correcting coils are positioned and shaped to generate a dipole field and a hexapole field;

wherein the correcting coils are positioned and shaped to generate a dipole field and a hexapole field.

2. The deflecting system according to claim 1, wherein the correcting coils are positioned and shaped to generate a dipole field and a hexapole field.

3. The deflecting system according to claim 1, further comprising at least a third deflector positioned between the first deflector and the second deflector for deflecting said charged particle beam.

4. The deflecting system according to claim 1, comprising at least a second deflecting pair of correcting coils.

5. The deflecting system according to claim 1 wherein the first deflector, the second deflector, and the deflecting pair of correcting coils deflect the charged particle beam within the first deflection plane.

6. The deflecting system according to claim 1, wherein the first direction and the second direction are essentially equal.

7. The deflecting system according to claim 1, wherein the at least one of the deflecting pair of correcting coils and at least one of the first and second deflectors are positioned with respect to each other to form a corrected deflector, such that vertical field projections of the deflecting pair of correcting coils and the deflector forming the corrected deflector therewith onto their respective axes overlap each other at least partially.

8. The deflecting system according to claim 7, wherein each of the first and second deflectors is a corrected deflector.

9. The deflecting system according to claim 7, wherein for at least one corrected deflector, the number N1 of windings of the deflecting coils is matched to the number N2 of windings of the according correcting coils to operate both pairs of coils with the same current source.

10. The deflecting system according to claim 7, wherein the deflector and the deflecting pair of correcting coils of the corrected deflector deflect the charged particle beam into the same direction to reduce the astigmatism of the deflection.

11. The deflecting system according to claim 7, wherein the points of deflection of the deflector and the deflecting pair of correcting coils of the corrected deflector have a distance which is smaller than the length of the correcting coils.

12. The deflecting system according to claim 1, wherein the correcting coils of the at least one deflecting pair of correcting coils are toroidal correcting coils having an opening angle smaller than 50 degrees.

13. The deflecting system according to claim 1, wherein the correcting coils of the at least one deflecting pair of coils are saddle-like correcting coils having an opening angle which deviates from 120 degrees by more than 10 degrees.

14. The deflecting system according to claim 13, wherein the opening angle of the saddle-like correcting coils is larger than 170 degrees.

15. The deflecting system according to claim 1, wherein the first deflector and the second deflector each comprise a pair of deflecting coils.

16. The deflecting system according to claim 15, wherein each pair of deflecting coils comprise a pair of saddle-like deflecting coils having an opening angle between 80 degrees and 160 degrees.

17. The deflecting system according to claim 15, wherein each pair of deflecting coils comprises a pair of toroidal deflecting coils having an opening angle between 100 degrees and 20 degrees.

18. The deflecting system according to claim 1, wherein pairs of the correcting coils each have the same number of windings.

19. The deflecting system according to claim 1, wherein the pair of correcting coils have the same current source.

20. The deflecting system according to claim 1, wherein the pair of correcting coils are essentially equally shaped coils.

21. The deflecting system according to claim 1, wherein the correcting coils are shaped and positioned according to a cylindrical, conic or shell-like structure.

22. The deflecting system according to claim 1, wherein the astigmatism caused by the deflections of the deflection system is reduced by the at least one deflecting pair of correcting coils by more than 50% compared to the astigmatism without operating the deflecting pair of correcting coils.

23. The deflecting system according to claim 1, wherein the deflection angles of the first deflector and the second deflector during normal operation are within the range of 2 degrees to 10 degrees.

24. The deflecting system according to claim 1, wherein the correcting coils of the at least one deflecting pair of correcting coils are toroidal correcting coils having an opening angle smaller than 20 degrees.

25. The deflecting system according to claim 1, wherein the correcting coils of the at least one deflecting pair of coils are saddle-like correcting coils having an opening angle which deviates from 120 degrees by more than 50 degrees.

26. A deflecting system for deflecting a charged particle beam from a first direction to a second direction, the deflecting system comprising:
a first magnetic deflector for deflecting said charged particle beam from the first direction; and
a second magnetic deflector for deflecting the deflected clmrged particle beam into the second direction, wherein at least one first and second of the magnetic deflectors comprises a pair of saddle-like deflecting coils having an opening angle between 121 degrees and 124 degrees.

27. A deflecting system for deflecting a charged particle beam from a first direction to a second direction, the deflecting system comprising:
a first magnetic deflector for deflecting said charged particle beam of the first direction; and
a second magnetic deflector for deflecting the deflected charged particle beam into the second direction, wherein at least one of the first and second magnetic deflectors comprises of a pair of toroidal deflecting coils having an opening angle between 56 degrees and 59 degrees.

28. A two-dimensional deflecting system comprising:
a first deflecting system for deflecting a charged particle beam from a first direction to a second direction comprising a first deflector for deflecting said charged particle beam off the first direction within a first deflection plane, a second deflector for deflecting the deflected charged particle beam into the second direction within the first deflection plane, and at least one deflecting pair of correcting coils which is positioned and shaped to deflect the charged particle beam and to reduce astigmatism of the charged particle beam caused by the deflections wherein the correcting coils are positioned and shaped to generate a dipole field and a hexapole field;

wherein the correcting coils are positioned and shaped to generate a dipole field and a hexapole field; and a second deflecting system for deflecting the charged particle beam within a second deflection plane from the first direction to a third direction; wherein the second deflection plane is orthogonal to the first deflection plane within 45 degrees.

29. The two-dimensional deflecting system according to claim 28, wherein the second deflection plane is orthogonal to the first deflection plane within 10 degrees.

30. The two-dimensional deflecting system according to claim 28, wherein said second deflecting system comprises:
a first orthogonal deflector for deflecting said charged particle beam off the first direction; and
a second orthogonal deflector for deflecting said charged particle beam into the third direction.

31. The two-dimensional deflecting system according to 30, wherein the first direction and the third direction are substantially equal.

32. The two-dimensional deflecting system according to claim 30, comprising at least a third orthogonal deflector positioned between the first orthogonal deflector and the second orthogonal deflector for deflecting said charged particle beam.

33. The two-dimensional deflecting system according to claim 30, wherein the second deflecting system comprises at least one deflecting orthogonal pair of correcting coils.

34. The two-dimensional deflecting system according to the claim 33, wherein the second deflecting system comprises at least two deflecting orthogonal pairs of correcting coils.

35. The two-dimensional deflecting system according to the claim 33, wherein the correcting coils are orthogonal saddle-like correcting coils having an opening angle which deviates from 120 degrees by more than 10 degrees.

36. The deflecting system according to claim 33, wherein the opening angle of the orthogonal saddle-like correcting coils is smaller than 110 degrees.

37. The two-dimensional deflecting system according to claim 33, wherein at least one orthogonal pair of correcting coils and at least one of the orthogonal deflectors are positioned to form an orthogonal corrected deflector.

38. The two-dimensional deflecting system according to claim 37, wherein at least one of the corrected deflectors comprises a compensating pair of correcting coils.

39. The two-dimensional deflecting system according to claim 38, wherein at least one of the orthogonal corrected deflectors comprises an orthogonal compensating pair of correcting coils, wherein the orthogonal compensating pair of corrected coils provide a hexapole component of opposite polarity relative to another orthogonal pair of correcting coils.

40. The two-dimensional deflecting system according to claim 37, wherein at least one of the corrected deflectors and at least one of the orthogonal corrected deflectors are positioned with respect to each other to form a two-dimensional corrected deflector.

41. A charged particle beam device, comprising:
a charged particle beam source to generate a charged particle beam; and
a first deflecting system for deflecting the charged particle beam from a first direction to a second direction comprising a first deflector for deflecting said charged particle beam off the first direction within a first deflection plane, a second deflector for deflecting the deflected charged particle beam into the second direction within the first deflection plane, and at least one deflecting pair of correcting coils which is positioned and shaped to deflect the charged particle beam and to reduce astigmatism of the charged particle beam caused by the deflections wherein the correcting coils are positioned and shaped to generate a dipole field and a hexapole field;

wherein the correcting coils are positioned and shaped to generate a dipole field and a hexapole field.

42. The charged particle beam device according to claim 41, wherein:
the charged particle beam is an electron beam; and
the charged particle beam device comprises an electron beam microscope.

43. The charged particle beam device according to claim 42, further comprising a high voltage beam tube to accelerate the electron beam.

* * * * *

UNITED STATES PATENT AND TRADEMARK OFFICE
CERTIFICATE OF CORRECTION

PATENT NO. : 7,075,075 B2
APPLICATION NO. : 10/871879
DATED : July 11, 2006
INVENTOR(S) : Pavel Adamec and Harry Munack It is certified that error appears in the above-identified patent and that said Letters Patent is hereby corrected as shown below:

In the Specification

Column 3, Line 67: Change "$_{system}$n" to --system in--

Column 4, Line 40: Change "Ic)" to --$I_c$--

Column 5, Line 10: Change "23" to --123--

Column 5, Line 61: Change "$_{system\ 1}$s" to --system is--

Column 6, Line 24: Change "he" to --be--

Column 7, Line 3: Change "as" to --$\alpha_s$--

Column 7, Line 3: Change "140 I6O" to --140, 160--

Column 7, Line 7: Insert a comma after "140"

Column 8, Line 21: Change the semicolon after "D2" to a comma

Column 8, Line 57: Insert a period after "length"

Column 9, Line 1: Change "arc" to --are--

Column 9, Line 12: Change "as" to --$\alpha_s$--

Column 9, Line 12: Change "Ws" to --$W_s$--

Column 9, Line 12: Change $L_5$" to --$L_s$--

Column 9, Line 49: Change "1" to --I--

Column 10, Line 9: Change the comma after "is" to a period

Column 10, Line 14: Change "as" to --$\alpha_s$--

UNITED STATES PATENT AND TRADEMARK OFFICE
CERTIFICATE OF CORRECTION

PATENT NO.         : 7,075,075 B2
APPLICATION NO. : 10/871879
DATED              : July 11, 2006
INVENTOR(S)        : Pavel Adamec and Harry Munack It is certified that error appears in the above-identified patent and that said Letters Patent is hereby corrected as shown below:

Column 10, Line 17: Change "as" to --$\alpha_s$--

Column 10, Line 21: Change "as" to --$\alpha_s$--

Column 10, Line 38: Change "LT" to --$L_T$--

Column 10, Line 39: Change "WT" to --$W_T$--

Column 10, Line 50: Change "as" to --$\alpha_s$--

Column 10, Line 58: Insert --)-- after "coils"

Column 10, Line 59: Change "as" to --$\alpha_s$--

Column 11, Line 32: Insert a period after the first instance of "75"

Column 11, Lines 35, 51, 58, 59, and 63: Change each instance of "as" to --$\alpha_s$--

Column 12, Lines 3 and 67: Change each instance of "as" to --$\alpha_s$--

Column 13, Line 7: Change "he to --be--

Column 13, Line 18: Change "as" to --$\alpha_s$--

Column 14, Line 11: Insert a period after "coils"

Column 14, Line 36: Change "an" to --$\alpha_s$--

Column 14, Line 42: Change "2h" to --2b--

Column 14, Line 43: Change "1c" to --$I_c$--

Column 15, Line 24: Change "pan" to --pair--

Column 15, Line 28: Change "$\alpha_T$" to --$\alpha_s$--

UNITED STATES PATENT AND TRADEMARK OFFICE
CERTIFICATE OF CORRECTION

PATENT NO. : 7,075,075 B2
APPLICATION NO. : 10/871879
DATED : July 11, 2006
INVENTOR(S) : Pavel Adamec and Harry Munack It is certified that error appears in the above-identified patent and that said Letters Patent is hereby corrected as shown below:

Column 15, Line 38: Change "$\alpha_T=180° \alpha_s$," to --$\alpha_T=180°-\alpha_s$--

Column 15, Line 41: Change "[80" to --180--

Column 15, Line 48: Change the comma after "combined" to a period

Column 15, Line 53: Change "I 7" to --17--

Column 16, Line 67: Change "correct" to --correcting--

Column 18, Line 12: Change "Lu" to --In--

Column 18, Line 15: Change the period after "6a" to a comma

Column 20, Line 13: Change "t" to --4--

Column 20, Line 16: Change "article" to --particle--

Column 20, Line 17: Change "(flown" to --shown--

Column 20, Line 48: Change "he" to --be--

Column 20, Line 56: Insert a period after "keV"

Column 21, Line 3: Change "he" to --the--

Column 21, Line 22: Change "CD1" to --CD3--

Column 21, Line 23: Insert a comma after "CD2"

Column 22, Line 39: Change "2-CI)2" to --2-CD2--

Column 22, Line 41: Change "CD1O2" to --CD102--

Column 23, Line 1: Delete the period after "175b"

Column 23, Line 15: Change "arc" to --are--

UNITED STATES PATENT AND TRADEMARK OFFICE
CERTIFICATE OF CORRECTION

| | | |
|---|---|---|
| PATENT NO. | : 7,075,075 B2 | |
| APPLICATION NO. | : 10/871879 | |
| DATED | : July 11, 2006 | |
| INVENTOR(S) | : Pavel Adamec and Harry Munack | |

It is certified that error appears in the above-identified patent and that said Letters Patent is hereby corrected as shown below:

Column 24, Line 2: Change "DI" to --D1--

Column 24, Line 3: Change "02" to --D2--

Column 24, Line 10: After "fourth", insert --orthogonal deflector D104.--

Column 24, Line 13: Change "I5" to --15--

Column 24, Line 42: change "75a. 75h" to --75a, 75b--

Column 24, Line 64: Insert a period after "degrees"

Column 24, Line 65: Change "pan" to --pair--

Column 24, Line 66: Change "75h" to --75b--

Column 24, Line 67: Change "75h" to --75b--

Column 25, Line 5: Change "75h" to --75b--

Column 25, Line 13: Change the comma after "10a" to a period

Column 25, Line 17: Change "110b" to --10b--

Column 25, Line 28: Change "CDIO2" to --CD102--

UNITED STATES PATENT AND TRADEMARK OFFICE
CERTIFICATE OF CORRECTION

PATENT NO.        : 7,075,075 B2
APPLICATION NO.   : 10/871879
DATED             : July 11, 2006
INVENTOR(S)       : Pavel Adamec and Harry Munack It is certified that error appears in the above-identified patent and that said Letters Patent is hereby corrected as shown below:

Column 25, Line 46: Change "75h" to --75b--

Column 25, Line 62: Change "$^1c$" to --$I_c$--

Column 26, Line 24: Change "I80" to --180--

Signed and Sealed this

Ninth Day of September, 2008

JON W. DUDAS
*Director of the United States Patent and Trademark Office*

UNITED STATES PATENT AND TRADEMARK OFFICE
CERTIFICATE OF CORRECTION

PATENT NO. : 7,075,075 B2
APPLICATION NO. : 10/871879
DATED : July 11, 2006
INVENTOR(S) : Pavel Adamec and Harry Munack It is certified that error appears in the above-identified patent and that said Letters Patent is hereby corrected as shown below:

In the Specification

Column 3, Line 67: Change "$_{system}$n" to --system in--

Column 4, Line 40: Change "Ic)" to --$I_c$--

Column 5, Line 10: Change "23" to --123--

Column 5, Line 61: Change "$_{system\ 1}$s" to --system is--

Column 6, Line 24: Change "he" to --be--

Column 7, Line 3: Change "as" to --$\alpha_s$--

Column 7, Line 3: Change "140 I6O" to --140, 160--

Column 7, Line 7: Insert a comma after "140"

Column 8, Line 21: Change the semicolon after "D2" to a comma

Column 8, Line 57: Insert a period after "length"

Column 9, Line 1: Change "arc" to --are--

Column 9, Line 12: Change "as" to --$\alpha_s$--

Column 9, Line 12: Change "Ws" to --$W_s$--

Column 9, Line 12: Change "$L_5$" to --$L_s$--

Column 9, Line 49: Change "1" to --I--

Column 10, Line 9: Change the comma after "is" to a period

Column 10, Line 14: Change "as" to --$\alpha_s$--

UNITED STATES PATENT AND TRADEMARK OFFICE
CERTIFICATE OF CORRECTION

PATENT NO. : 7,075,075 B2
APPLICATION NO. : 10/871879
DATED : July 11, 2006
INVENTOR(S) : Pavel Adamec and Harry Munack It is certified that error appears in the above-identified patent and that said Letters Patent is hereby corrected as shown below:

Column 10, Line 17: Change "as" to --$\alpha_s$--

Column 10, Line 21: Change "as" to --$\alpha_s$--

Column 10, Line 38: Change "LT" to --$L_T$--

Column 10, Line 39: Change "WT" to --$W_T$--

Column 10, Line 50: Change "as" to --$\alpha_s$--

Column 10, Line 58: Insert --)-- after "coils"

Column 10, Line 59: Change "as" to --$\alpha_s$--

Column 11, Line 32: Insert a period after the first instance of "75"

Column 11, Lines 35, 51, 58, 59, and 63: Change each instance of "as" to --$\alpha_s$--

Column 12, Lines 3 and 67: Change each instance of "as" to --$\alpha_s$--

Column 13, Line 7: Change "he" to --be--

Column 13, Line 18: Change "as" to --$\alpha_s$--

Column 14, Line 11: Insert a period after "coils"

Column 14, Line 36: Change "an" to --$\alpha_s$--

Column 14, Line 42: Change "2h" to --2b--

Column 14, Line 43: Change "1c" to --$I_c$--

Column 15, Line 24: Change "pan" to --pair--

Column 15, Line 28: Change "$\alpha_T$" to --$\alpha_s$--

UNITED STATES PATENT AND TRADEMARK OFFICE
CERTIFICATE OF CORRECTION

PATENT NO. : 7,075,075 B2
APPLICATION NO. : 10/871879
DATED : July 11, 2006
INVENTOR(S) : Pavel Adamec and Harry Munack It is certified that error appears in the above-identified patent and that said Letters Patent is hereby corrected as shown below:

Column 15, Line 38: Change "$\alpha_T=180° \alpha_s$," to --$\alpha_T=180°-\alpha_s$--

Column 15, Line 41: Change "[80" to --180--

Column 15, Line 48: Change the comma after "combined" to a period

Column 15, Line 53: Change "I 7" to --17--

Column 16, Line 67: Change "correct" to --correcting--

Column 18, Line 12: Change "Lu" to --In--

Column 18, Line 15: Change the period after "6a" to a comma

Column 20, Line 13: Change "t" to --4--

Column 20, Line 16: Change "article" to --particle--

Column 20, Line 17: Change "(flown" to --shown--

Column 20, Line 48: Change "he" to --be--

Column 20, Line 56: Insert a period after "keV"

Column 21, Line 3: Change "he" to --the--

Column 21, Line 22: Change "CD1" to --CD3--

Column 21, Line 23: Insert a comma after "CD2"

Column 22, Line 39: Change "2-CI)2" to --2-CD2--

Column 22, Line 41: Change "CD1O2" to --CD102--

Column 23, Line 1: Delete the period after "175b"

Column 23, Line 15: Change "arc" to --are--

UNITED STATES PATENT AND TRADEMARK OFFICE
CERTIFICATE OF CORRECTION

PATENT NO. : 7,075,075 B2
APPLICATION NO. : 10/871879
DATED : July 11, 2006
INVENTOR(S) : Pavel Adamec and Harry Munack It is certified that error appears in the above-identified patent and that said Letters Patent is hereby corrected as shown below:

Column 24, Line 2: Change "DI" to --D1--

Column 24, Line 3: Change "02" to --D2--

Column 24, Line 10: After "fourth", insert --orthogonal deflector D104.--

Column 24, Line 13: Change "I5" to --15--

Column 24, Line 42: Change "75a. 75h" to --75a, 75b--

Column 24, Line 64: Insert a period after "degrees"

Column 24, Line 65: Change "pan" to --pair--

Column 24, Line 66: Change "175h" to --175b--

Column 24, Line 67: Change "75h" to --75b--

Column 25, Line 5: Change "75h" to --75b--

Column 25, Line 13: Change the comma after "10a" to a period

Column 25, Line 17: Change "110b" to --10b--

Column 25, Line 28: Change "CDIO2" to --CD102--

UNITED STATES PATENT AND TRADEMARK OFFICE
CERTIFICATE OF CORRECTION

PATENT NO.      : 7,075,075 B2
APPLICATION NO. : 10/871879
DATED           : July 11, 2006
INVENTOR(S)     : Pavel Adamec and Harry Munack It is certified that error appears in the above-identified patent and that said Letters Patent is hereby corrected as shown below:

Column 25, Line 46: Change "75h" to --75b--

Column 25, Line 62: Change "$^1c$" to --$I_c$--

Column 26, Line 24: Change "I80" to --180--

This certificate supersedes the Certificate of Correction issued September 9, 2008.

Signed and Sealed this

Sixteenth Day of June, 2009

JOHN DOLL
*Acting Director of the United States Patent and Trademark Office*